US011721508B2

(12) United States Patent
Telefus et al.

(10) Patent No.: US 11,721,508 B2
(45) Date of Patent: Aug. 8, 2023

(54) SOLID-STATE GROUND-FAULT CIRCUIT INTERRUPTER

(71) Applicant: AMBER SEMICONDUCTOR, INC., Danville, CA (US)

(72) Inventors: Mark Telefus, Orinda, CA (US); Stephen C. Gerber, Austin, TX (US)

( * ) Notice: Subject to any disclaimer, the term of this patent is extended or adjusted under 35 U.S.C. 154(b) by 0 days.

(21) Appl. No.: 17/660,785

(22) PCT Filed: Jun. 12, 2019

(86) PCT No.: PCT/US2019/064900
§ 371 (c)(1),
(2) Date: Apr. 26, 2022

(87) PCT Pub. No.: WO2021/112870
PCT Pub. Date: Jun. 10, 2021

(65) Prior Publication Data
US 2022/0399174 A1    Dec. 15, 2022

(51) Int. Cl.
*H02H 3/00*    (2006.01)
*H02H 9/08*    (2006.01)
(Continued)

(52) U.S. Cl.
CPC ....... *H01H 71/125* (2013.01); *G01R 31/3277* (2013.01); *H01H 9/548* (2013.01); *H01H 83/04* (2013.01)

(58) Field of Classification Search
CPC ...... H01H 71/125; H01H 9/548; H01H 83/04; G01R 31/3277
(Continued)

(56) References Cited

U.S. PATENT DOCUMENTS

| 4,806,844 A | 2/1989 | Claydon et al. |
| 6,111,733 A | 8/2000 | Neiger et al. |

(Continued)

FOREIGN PATENT DOCUMENTS

| WO | 2017196571 | 11/2017 |
| WO | WO 2017/196572 | 11/2017 |

(Continued)

OTHER PUBLICATIONS

Darmayuda et al, Ultra Fast Solid State Ground Fault Isolator, World Academy of Science, Engineering and Technology International Journal of Electronics and Communication Engineering vol. 6, No. 9, 2012.

*Primary Examiner* — Jared Fureman
*Assistant Examiner* — Lucy M Thomas
(74) *Attorney, Agent, or Firm* — Mark Wisnosky

(57) ABSTRACT

Ground-fault circuit interrupter positioned between energy controlled supply circuit and load circuit which includes fault detection circuit that senses ground path current leakage to the load circuit, fault processing circuit that detects presence of fault and generates fault output signal when fault detected, and control circuit switch connected to fault processing signal output, wherein control circuit switch is opened by presence of fault output signal, thus isolating load circuit from supply circuit. Preferably fault processing circuit and control circuit are optically linked, such that when fault is detected, control circuit switch is opened by optical fault output signal, thus isolating load circuit from the supply circuit. Circuit interrupter may couple another circuit interrupter via power distribution control unit, optionally manageable remotely via automated control interface.

30 Claims, 22 Drawing Sheets

(51) Int. Cl.
*H01H 71/12* (2006.01)
*G01R 31/327* (2006.01)
*H01H 9/54* (2006.01)
*H01H 83/04* (2006.01)

(58) Field of Classification Search
USPC .......................................................... 361/42
See application file for complete search history.

(56) References Cited

U.S. PATENT DOCUMENTS

| | | | |
|---|---|---|---|
| 6,437,955 B1* | 8/2002 | Duffy | H02H 9/026 |
| | | | 361/45 |
| 7,136,265 B2 | 11/2006 | Wong et al. | |
| 8,174,804 B2 | 5/2012 | Fasano | |
| 8,737,030 B2 | 5/2014 | Valdes | |
| 9,608,430 B2 | 3/2017 | Duan et al. | |
| 9,759,758 B2 | 9/2017 | Ostrovsky et al. | |
| 9,978,553 B2 | 5/2018 | Tomimbang et al. | |
| 10,135,235 B2 | 11/2018 | Cai et al. | |
| 10,243,350 B2 | 3/2019 | Pan et al. | |
| 11,201,460 B2* | 12/2021 | Oishi | H02H 7/20 |
| 2003/0125885 A1 | 7/2003 | Dougherty et al. | |
| 2008/0234879 A1 | 9/2008 | Fuller | |
| 2012/0092797 A1* | 4/2012 | Reeder | H02H 1/0007 |
| | | | 361/31 |
| 2013/0033246 A1* | 2/2013 | Krenz | H05B 1/0236 |
| | | | 323/282 |
| 2013/0265041 A1 | 10/2013 | Friedrich et al. | |
| 2017/0104325 A1 | 4/2017 | Eriksen et al. | |
| 2017/0256934 A1* | 9/2017 | Kennedy | H02H 3/20 |
| 2018/0059175 A1* | 3/2018 | Hase | G01R 31/52 |
| 2018/0083438 A1* | 3/2018 | Reed | H05B 47/25 |
| 2018/0316179 A1 | 11/2018 | Ofek | |

FOREIGN PATENT DOCUMENTS

| | | |
|---|---|---|
| WO | WO 2017/196649 | 11/2017 |
| WO | WO 2018/075726 | 4/2018 |
| WO | WO 2018/080604 | 5/2018 |
| WO | WO 2018/081619 | 5/2018 |
| WO | WO 2018/080614 | 6/2018 |
| WO | 2018159914 | 9/2018 |

* cited by examiner

SOLID-STATE GROUND-FAULT CIRCUIT INTERRUPTER

CROSS-REFERENCE TO RELATED APPLICATIONS

This application is the US National Phase application of PCT/US2019/064900, filed 6 Dec. 2019.

STATEMENT REGARDING FEDERALLY SPONSORED RESEARCH OR DEVELOPMENT

Not Applicable.

FIELD OF INVENTION

The invention relates to protection devices (circuit breakers and resettable fuses) and power safety controllers. The preferred embodiment describes a power controller related to the automatic and manual operation of a ground-fault circuit interrupter or residual current device.

BACKGROUND OF INVENTION

A typical residential electrical utility supply is a 3-wire, 240 volt split-phase alternating current source provided by the secondary windings of a center-tapped utility transformer, wherein the center tap is connected to earth ground. The 240 V source between the secondary ("hot") conductors is used to power highly consumptive appliances such as electrical stove tops and ovens, air-conditioners, etc. while single-phase power to the normal 120 V distributed lighting/appliance circuits is provided between either of the "hot" conductors and the center tap ("neutral") conductor. Ground-fault circuit interrupters (GFCIs) are an increasingly important addition to electrical distribution systems to protect users from electrocution due to unintended/accidental current paths from either line "hot" conductor to earth ground instead of to the line "neutral" conductor. Such unintended/accidental current paths are most likely to occur when electrical appliances are used in proximity to exposed conductors connected to earth ground, such as plumbing fixtures in kitchens and bathrooms or grounded metal structures located outside the residence. GFCIs are typically found in two formats in a residential or light industrial application: integrated within a conventional 120V electrical outlet or integrated within a circuit breaker device mounted within an electrical distribution panel.

GFCIs are designed to sense an imbalance in the current flowing into a load from a "hot" conductor and returning from the load via a "neutral" conductor, thereby indicating a potential unintended/accidental current path from the "hot" conductor and returning to the "neutral" conductor directly through earth ground. Such a spurious return path can exist, for example, when an electrical hair dryer is accidently dropped into a sink or bathtub full of water. The GFCI is designed to open the electrical circuit using internal mechanical switches and interrupt current flow ("trip") when the device detects spurious "leakage" current above a set threshold flowing through such an unintended/accidental path. The threshold for most residential applications is 0.005 Amperes or 5 mA. For conventional state-of-the-art GFCIs, detecting a current imbalance of 5 mA on a load current that may be 4,000 times larger (20 Amperes) and in the presence of a noisy load or noisy AC supply, is a challenging requirement and results in a significant number of nuisance trips experienced during the life of the product. This ratio becomes more problematic with higher load currents, or when the imbalance threshold is reduced to 1 or 2 mA for particularly wet locations, such as for swimming pool lighting. The conventional methods of current imbalance detection based on magnetic sensors such as current transformer (CT) or Hall effect sensors perform very unreliably in hostile EMI environment, causing the triggering of nuisance trips. It is therefore desirable to develop ground-fault sensing technology with higher noise immunity and higher dynamic range. Another significant problem with conventional GFCIs is that they are slow to react to faults. Mechanical switches in the internal lines that connect the load to the "hot" and "neutral" conductors are normally closed but are spring loaded and open the circuits when released by mechanical latches triggered by electromagnets that are powered by the current imbalance mentioned above. Conventional GFCIs typically exhibit a delay of at least several milliseconds between the occurrence of an excessive current imbalance and load isolation. This delay time is undesirable since it raises the risk of electrocution. Additionally, the delay time in conventional GFCIs is highly variable. The variation is predominately due to the limitations of the magnetic and mechanical design and the influence of physical factors such as mounting stresses and operating temperature. The delay time can vary from device to device even when the devices are of the same type, the same rating, and the same manufacturer.

The GCFI delay time may also adversely impact the current imbalance threshold determination causing additional cost and inconvenient nuisance trips. The physical separation of the mechanical switch contacts also creates dangerous arcing conditions that may trigger the explosion of volatile gases that may be present in the environment. It is therefore a further desirable goal to develop ground-fault sensing technology with smaller load disconnection delay times, preferably with solid-state switching, exhibiting smaller variability and no arcing.

Early receptacle-based ground-fault circuit interrupters, many of which are still in use today, implement current sensing and switching technology that is prone to failing with the mechanical switches in the closed position. These failures result in a functioning receptacle lacking the intended ground-fault protection. Additionally, these early GFCIs do not include a self-test function or an end-of-life indication. To complicate matters, most property owners never test their GFCIs and those that do commonly test them improperly. More recent GFCI designs have adopted a self-test capability which is an out-growth of the relative unreliability of the electromechanical nature of conventional GFCIs. It is therefore desirable to develop smart solid-state technology to improve the reliability of GFCI devices.

Property owners and those served by GFCIs are often inconvenienced by GFCIs. For example, new home builders commonly receive warranty repair requests for GFCI protected outlets that have tripped at the up-stream GFCI, yet appear as non-functional to the user because they are unable to recognize the trip event of a GFCI or are unable to identify the location of the tripped GFCI which may be located in an entirely different area of the room or neighboring room. This inconvenience is offset by the relative safety improvement in relation to a traditional electrical receptacle; however, an improvement in convenience is likely to expand GFCI adoption and save more lives. Moreover, construction companies report that GFCI problems are their number one cause for warranty claims. Among the problems with GFCIs include simple electromechanical failures, nuisance trips, the need for manual device testing, and a lack of understanding of upstream GFCIs as described above. Nuisance trips occur when a normally functioning load or circuit trips the GFCI when it shouldn't. Nuisance trips are particularly problematic when constant power to the load is required, such as a freezer plugged into a garage or laundry room wall receptacle. Upstream GFCIs make it difficult for users to identify where to go to correct the circuit interruption and to discover which receptacle caused the trip. It is therefore desirable to develop smart solid-state GFCIs that eliminate the inconvenient aspects of poor device reliability, nuisance trips, manual testing, and up-stream device confusion with the additional benefits related to communicating the characteristics of trip events.

It is further desirable to develop smart solid-state GFCIs with adjustable trip thresholds. It is yet further desirable to have a smart solid-state GFCI with built-in load over-current protection.

It is also desirable to have a GFCI connected, operate, and control via wireless connectivity means with the included features of wireless trip notifications and remote disconnect.

Moreover, it is desirable to have a GFCI control safe power delivery and also provide the energy consumption data.

It is desirable to have a GFCI able to exchange data and provide power management within the branch.

It is also desirable to have a GFCI equipped to communicate the power delivery and leakage in real time.

Another desirable aspect is to have a GFCI fully comply and operated via public or private network to store and respond to remote requests.

It is further desirable to have a GFCI to become an alarm source, notifying a user of excessive power usage, change of state, or end-of-life.

GFCI device acquisition and installation costs prohibit worldwide adoption of ground-fault sensing. Improving reliability, performance, and convenience of GFCIs through the use of solid-state technologies promises to add additional value and reduce the cost of the various functions with technology advancement. It is therefore desirable to develop smart solid-state technology to improve the costs and value perception of GFCI devices such that adoption becomes more prevalent and more lives are saved.

Further advancements in technology are enabling the integration of smart electronics with sensors and wireless connectivity. These advancements will enable energy sensing, enhanced situational awareness, remote monitoring and control, including the ability for remote disablement of circuits, particularly during emergencies or peak utility loads. As devices become more interconnected, the need for better protection, new functions, additional control, convenience, safety, and more information increases. As these needs become more important over time, new methods and devices are required. Examples of prior art that addresses some, but not all, of the deficiencies include publication WO 2018/159914 of Wellim Inc., US patent publication US 2008/0234879 from inventors Fuller et al, US patent publication US2017/0104325 assigned to Brainwave Research Corporation and U.S. Pat. No. 6,807,035 from inventors Baldwin et al. This application addresses further modernization of ground-fault circuit interrupters as described in detail below.

DETAILED DESCRIPTION

We disclose herein smart mechanical solid-state ground-fault circuit interrupters and smart solid-state ground-fault circuit interrupters. Said ground-fault circuit interrupters combine one or multiple of the methods disclosed below. A person of skill in the art will recognize that different aspects from the disclosed embodiments can also be combined. A ground-fault circuit interrupter is an automatically operated electrical switch designed to protect living things from electrocution. GFCIs exist within an electric circuit branch. GFCIs are most commonly integrated within receptacles, circuit breakers, cords, and power strips. This disclosure describes a GFCI application primarily within a wall receptacle; however, the techniques described within may be implemented within any electrical device or load in the circuit.

The basic function of a GFCI is to interrupt current flow after a current leakage fault is detected, often referred to in this document as a disconnected, open, trip or tripped condition.

Figure 1:
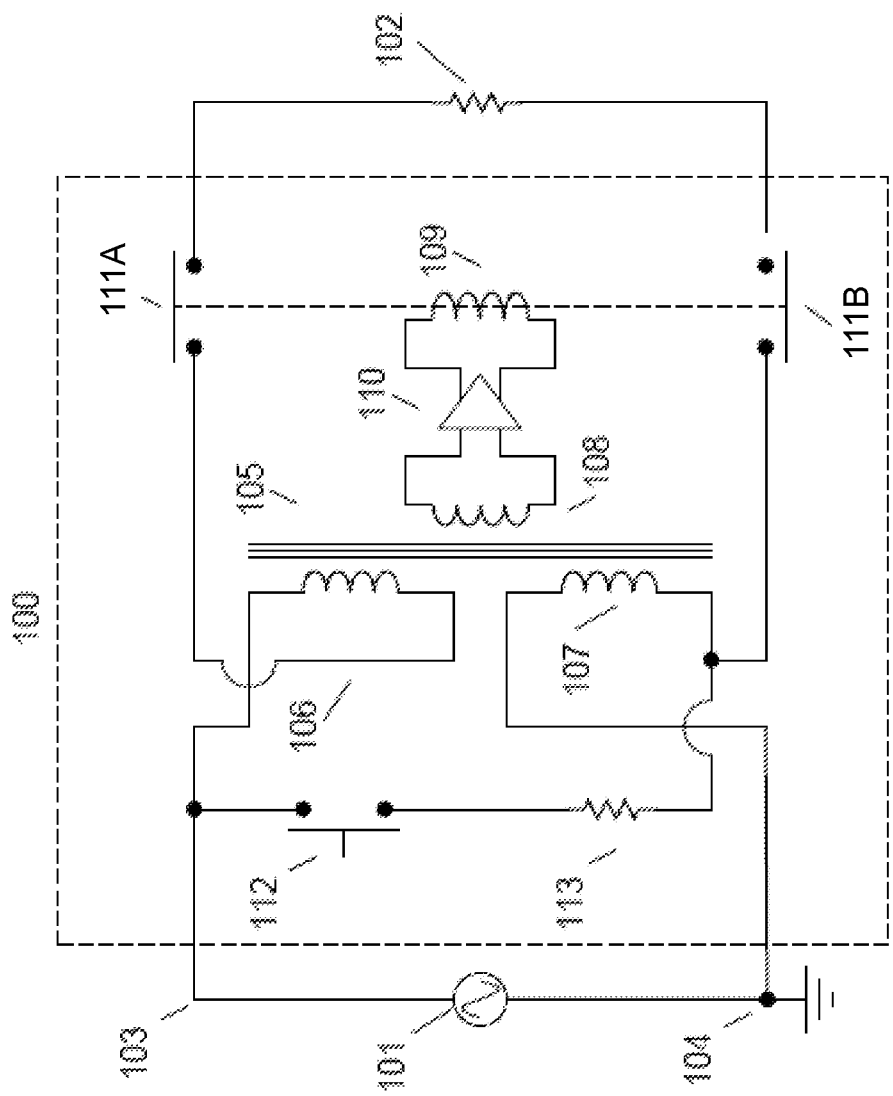
FIG. 1 discloses the system level block diagram for a prior art Ground-Fault Circuit Interrupter.

A GFCI's primary purpose is to protect life from electrocution. The following disclosed technologies serve society by improving upon the functionality and characteristics of common GFCIs. The improvements address improved safety, expanded convenience, added energy awareness, improved control, energy savings, and improved situational awareness. The disclosed technology enables and combines an array of novel techniques, including AC Mains switching techniques, AC to DC conversion techniques, internal short-circuit trip techniques, techniques to communicate status and sensor data wirelessly to enable a variety of innovative use cases, algorithms for detecting faults, techniques for detecting and protection from internal device failures, techniques for handling new types of loads through over-the-air updates, techniques for cloud services support for remote notifications, techniques enabling improved control, monitoring and big data collection, including during collapsing utility events. The disclosed technology further enables and combines circuit techniques for shunt-resistor current sensing, energy metering, and over-current detection, and techniques for avoiding fault conditions. These are novel techniques in and by themselves, but their true impact in terms of addressing the challenges of improving safety, expanded convenience, added energy awareness, control, energy savings, and improved situational awareness lies in their combination. The combination of these concepts is detailed in this disclosure. FIG. 1 discloses the system level block diagram for a prior art Ground-Fault Circuit Interrupter 100 as integrated within a conventional 120V electrical outlet. The utility supply 101 is connected to the load 102 through GFCI 100 from line "hot" 103 and line "neutral" 104 conductors. A current transformer 105 includes dual primary windings 106 in series with the "hot" line and 107 in series with the "neutral" line, and secondary 108. Connections to primary windings 106 and 107 are arranged so that the resulting current in secondary 108 is proportional to the difference between the currents in the primaries. Secondary 108 is connected to AC solenoid 109 through amplifier 110 which circuit is designed to "trip" normally closed, spring-loaded switches 111A located in the "hot" circuit branch and 111B located in the "neutral branch, when the difference in the primary currents exceeds the desired leakage current threshold, typically 5 mA in most applications. A push-to-test button 112 is optionally included for manual trip test functionality and can be, for instance, a simple mechanical momentary push-button switch. Current limit resistor 113 limits the test current injected into primary 107 to slightly more than the current sensing imbalance threshold of typically 5 mA in many applications.

One skilled in the art will recognize that switch 111A is normally adequate to open the "hot" line to the electrical load 102 and that switch 111B appears to be redundant. The double switch configuration is used in case the outlet is accidently wired with the "hot" and "neutral" lines reversed to ensure that the "hot" line to the load is interrupted in any case. In the descriptions of the GFCI embodiments below, it will be understood that the switches shown in the "neutral" line are optional in applications where the possibility of the reversal of "hot" and "neutral" electrical supply lines is eliminated by virtue of the mechanical mounting environment, for example, within a circuit breaker device housing as mounted within an electrical supply distribution panel.

Figure 2:
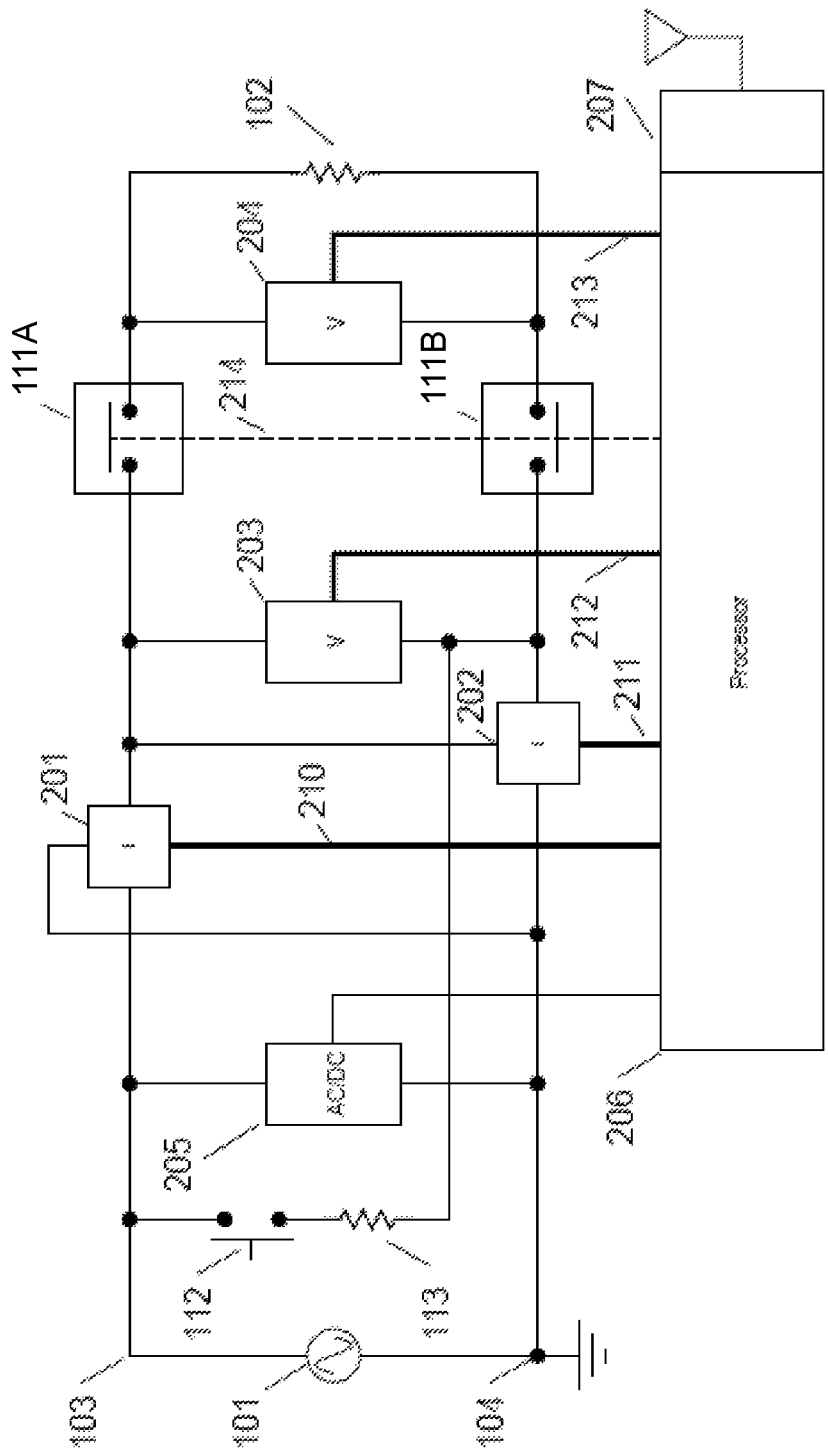
FIG. 2 shows a block diagram of elements of the invented ground-fault circuit interrupter.

FIG. 2 shows a block diagram of elements of the invented ground-fault circuit interrupter. A primary purpose of the device, as for prior art devices, is to detect an imbalance between the currents in the "hot" 103 and "neutral" branches 104 of the circuit from AC source 101 to load 102. Such an imbalance would indicate a current path to earth ground other than through the load 102, and, cause switches 111A, B to open, thereby isolating the load 102 from source 101.

Current sensors are located on the "hot" branch 201 and on the "neutral" branch 202 of the AC source 101. In the preferred embodiment the sensor units 201, 202 are integrated subsystems including power supplies, current sense devices, analog interface circuits, analog-to-digital converters, digital signal processing and digital interface circuits and provide highly accurate digital signals, representing the branch currents, that are electrically isolated from the voltage waveform on the measured line, to a central microprocessor 206, powered by independent power supply 205, via bidirectional digital data lines 210 and 211.

Voltage sensors 203 and 204 are located before switch 111A (203) and at load 102 (204) and communicate highly accurate digital signals, representing circuit voltages, that are electrically isolated from the voltage waveforms on the measured lines, to central microprocessor 206 via bidirectional digital data lines 212 and 213.

The microprocessor 206 includes the functionality known in the art to be included with microprocessors such as I/O, memory, a processor and a user interface. In one embodiment the microprocessor 206 further includes a communication device 207 to send and receive electronic communication from and to the GFCI. The communication may include the status of the GFCI, such as notification of a fault, or that the GFCI is functioning properly. The microprocessor 206 is further programmed to send alerts out the communication device upon detection of a fault condition, and, to receive operating instructions. The operating instructions include programming the microprocessor to both open and close the switches 111A, B, thereby enabling remote actuation of the GFCI. The operating instructions may also include limits used to determine fault conditions. Communication may also include status of other sensors, such as integrated voltage sensor units 203 and 204 that may be further incorporated into the GFCI. Other sensors may also include current sensors, power sensors, internal short circuit sensors, voltage and current zero crossing sensors, and sensors combined with algorithms within the microprocessor 206 that allow identification of the type of load. In a preferred embodiment the communication device 207 is a radio for remote wireless communication. The communication may be through wired and wireless means, including near field communication, local area networks, cellular networks, and the Internet.

The microprocessor is programmed to compare the digitized signals received from current sensors 201 and 202. Comparison may include use of historical data acquired from sensors 201 and 202 and use of data from other sensors 203 and 204, as well as data that may be received from remote locations through the radio interface 207. In some embodiments the comparison includes use of information as to the type of load 102. Example information may include whether the load 102 is a resistive load or an inductive load. If the comparison indicates an imbalance in the current flowing through the two sides of the circuit, the microprocessor sends a signal that opens the switches 111A, B, thereby disconnecting the load 102 from the supply 101. In one embodiment the comparison is the values for the voltage drop across the hot and neutral sense resistors and if the differences exceed a pre-selected value a ground fault condition is determined, and the switches are opened to disconnect the power source from the load. In one embodiment the switches 111A, B are individual electromechanical switches. In another embodiment the switches 111A, B are incorporated into a mechanical double pole switch as is known in the art. In one embodiment, the sensors 201, 202 represent hall sensors.

Figure 3:
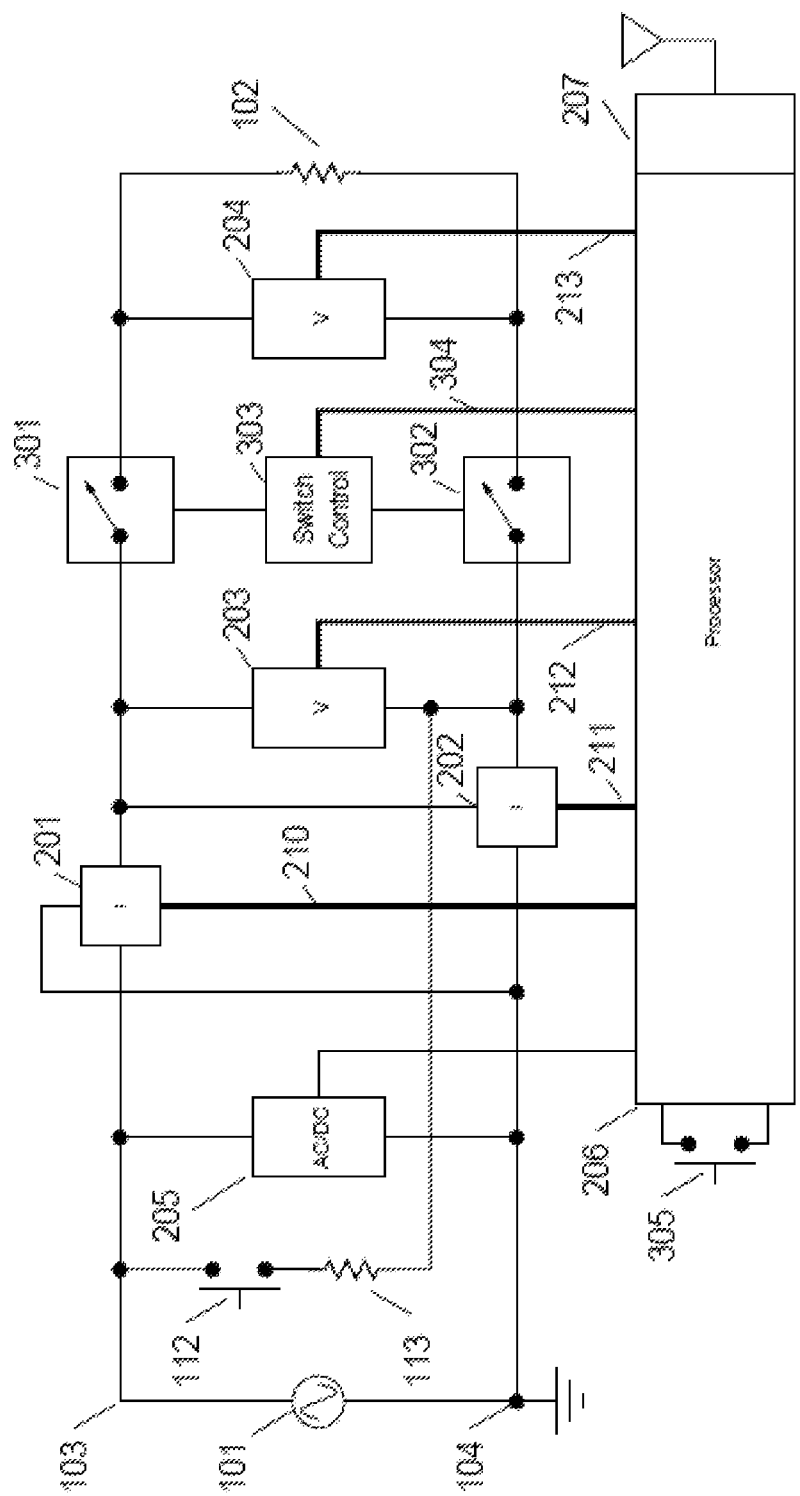
FIG. 3 shows an embodiment in which the GFCI switches are solid state switches.

FIG. 3 shows another embodiment in which the switches are solid state switches 301 and 302. This embodiment also requires a more complex switch control circuit 303 in communication with microprocessor 206 through bidirectional digital data line 304. It also requires a separate manual reset function, such as pushbutton switch 305 that accomplishes an electrical reset through microprocessor 206.

Figure 4:
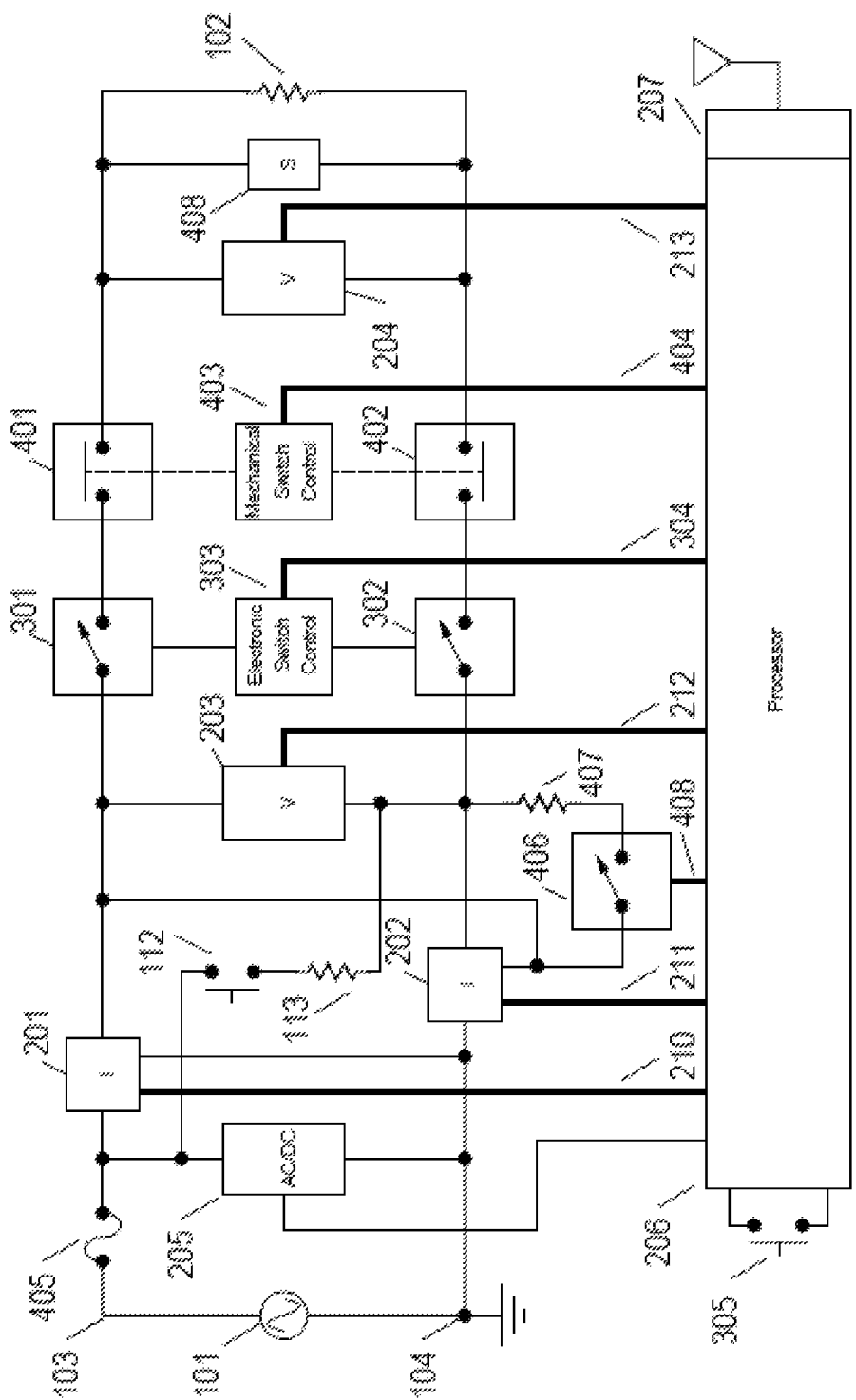
FIG. 4 illustrates an embodiment in which the GFCI is implemented using both solid state switches and electromechanical switches.

FIG. 4 illustrates yet another embodiment in which the switches are implemented using both solid state switches 301, 302 and electromechanical switches 401, 402 connected in series. In a preferred embodiment both the mechanical and the solid state switches are controlled by the microprocessor 206 such that at startup or reset, power is supplied to mechanical switches only if the source voltage is less than a pre-selected limit, thereby avoiding arcing which is common with mechanical switches actuated at high voltages. Thus, mechanical switches 401 and 402 are controlled by a separate switch control circuit 403 which is in communication with microprocessor 206 through bidirectional digital data line 404.

A fuse 405 is added to the system to protect the system from internal failure or to provide a simple end-of-life protection mechanism, such as in the event of a device failure. The fuse 405 is opened by an internal short-circuit switch 406, controlled by microprocessor 206, and having high current capacity between AC circuit branches. The internal short circuit switch 406 is designed to carry the necessary current to open fuse 405, and, may be implemented in a variety of means, the preferred embodiment is a switch with a series current-limiting resistance 407 configured to open fuse 405, but, not cause an up-stream fault. The microprocessor is programmed to receive signals from the voltage sense devices 203, 204 and if such signals indicate an open circuit in any of switches 301, 302 401, or 402 to send a communication of failure out port 207 and de-activate the GFCI by activating switch 406 thus opening fuse 405.

A further protection circuit includes a snubber 408, as is known in the industry to protect the internal components from damage due to energy kick-back from inductive loads.

Figure 5:
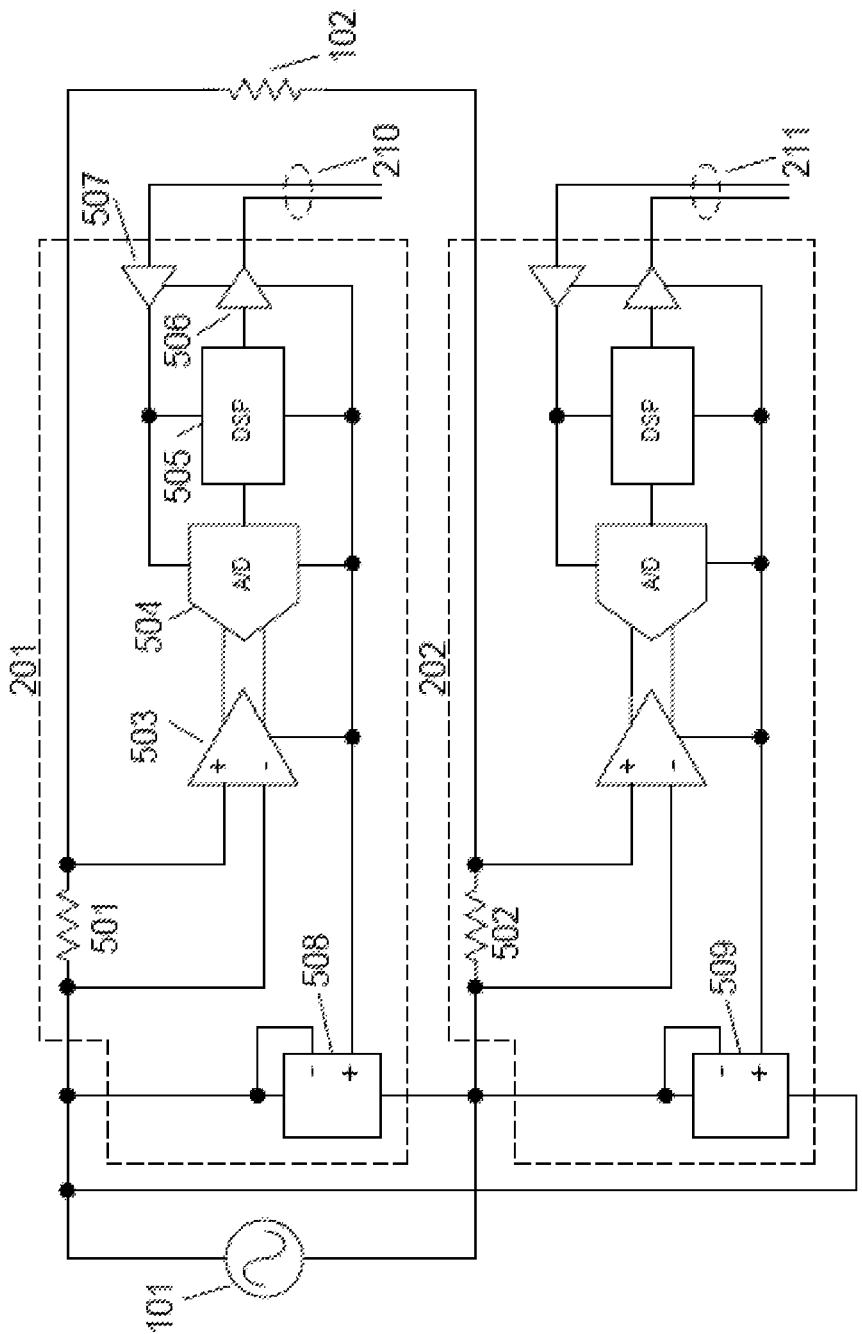
FIG. 5 shows current sensing circuits using sense resistors.

FIG. 5 details the block diagram for a current sensing circuits 201, 202. Each includes a sense resistor 501, 502 a traditional precision resistor component, to create a burden voltage based upon the total current to (and from) the load. The voltage drop across the sense resistor 501 is buffered by a programmable gain amplifier 503 and then applied to the input of an analog-digital (A/D) converter 504. The digital signal is buffered and communicated by digital signal processor 505. The digital output signal and external digital input signals to digital signal processor 505 are buffered through optical isolators 506 and 507 and multiplexed onto bidirectional digital bus 210 to communicate with microprocessor 206. The equivalent components in the current sense circuit 201 on the "hot" side are included in the current sense circuit 202 on the "neutral" side which communicates with the microprocessor 206 via bidirectional digital bus 211. Power is supplied to the current sense circuits 201 and 202 from independent power supplies 508 and 509, respectively. Power supply 508 provides a filtered DC operating voltage referenced to the "hot" line for the elements of current sense circuit 201 while power supply 509 provides a filtered DC operating voltage referenced to the "neutral" line for the elements of current sense circuit 202.

AC to DC Converter

Figure 6:
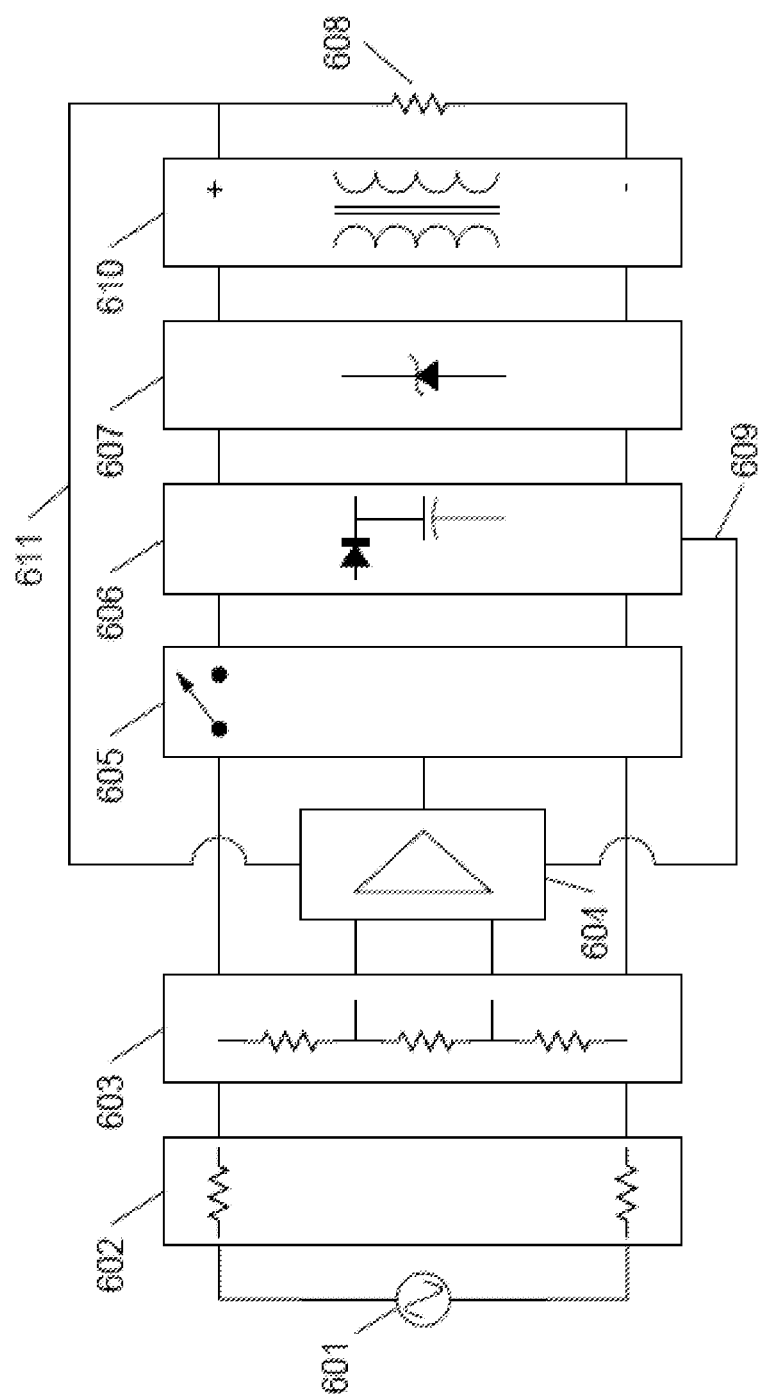
FIG. 6 shows an embodiment of an AC to DC converter used in some embodiments of the GFCI.
Figure 7:
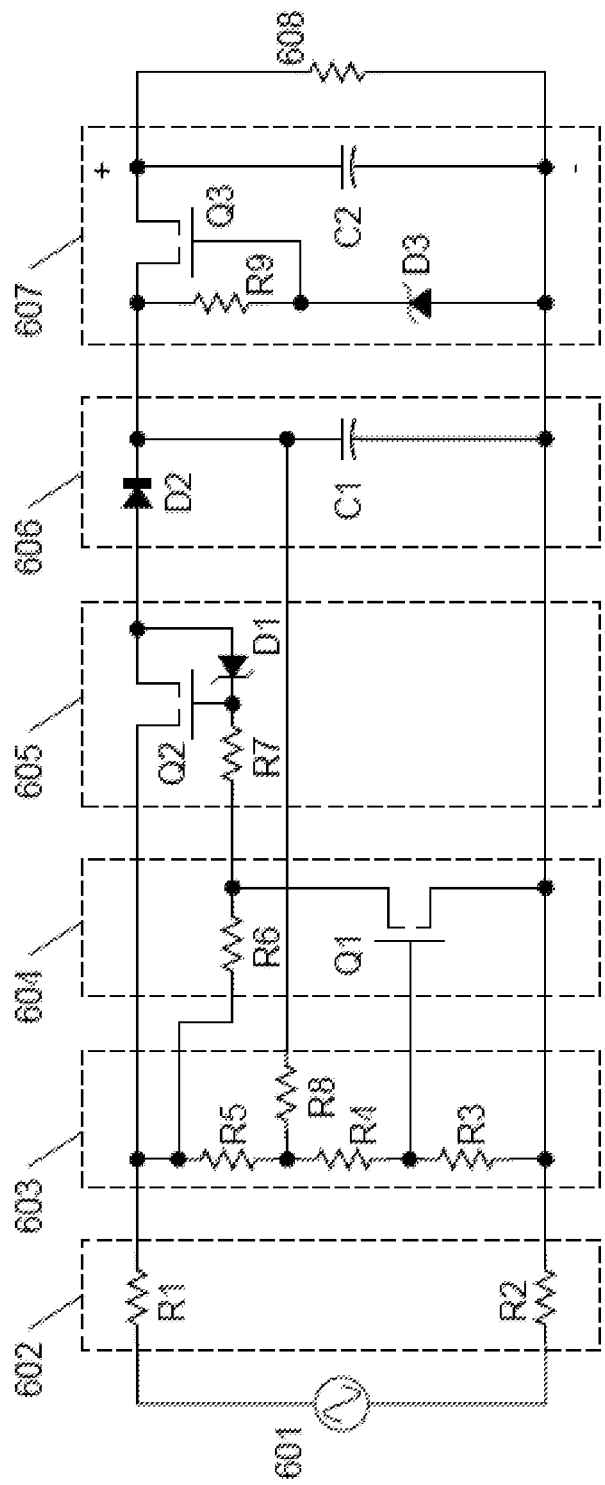
FIG. 7 shows more details of the AC/DC converter of FIG. 6.

The AC to DC converter 205, 508, 509, that does not require a rectifier, is comprised, generally, of the elements shown in FIG. 6 and the method implied by these elements. A non-limiting specific example of the circuit elements is shown in FIG. 7. Referring to FIG. 6 the AC source 601 is connected to an inrush protection element 602. In one embodiment the inrush element is comprised of resistor elements in the line and neutral of the AC supply. In another embodiment, where higher power and efficiency is required the inrush protection includes switch elements that provide high resistance at startup and switch the resistor elements out of the circuit at steady state operation. After the inrush protection the AC source is sampled using a sampling element 603. In one embodiment the sampling element 603 includes resistors configured into a voltage divider network. In another embodiment the sampling element includes a reference voltage source and comparator. In another embodiment the sampling element can be manually adjusted. In another embodiment the sampling element can be automatically adjusted. The sampled voltages are used as supply to a switch driver element 604. In the preferred embodiment, the switch driver element 604 receives a feedback voltage signal 609 from the storage element 606 and based upon the voltage signal, controls the voltage applied to the gate of a switching element in the control switch and clamp element 605, thereby opening and closing the control switch 606 to supply power to the storage element 606 and ultimately the load 608. In one embodiment, where the feedback 609 is removed, the AC to DC converter is a feed forward converter where charging of the storage element 606 is controlled from the forward side 603, 604 and 605. Addition of the feedback control 609 provides a means for both feed forward and feedback control. In one embodiment the balance of feed forward and feedback control is determined by the selection of components in the voltage sampling element 603 and the feedback line 609. In one embodiment the balance of feedforward and feedback control is determined by resistor elements in the sampling element 603 and the feedback 609. In another embodiment variable elements are used such that the feedforward and feedback control can be adjusted. In a preferred embodiment the switch driver is comprised of a voltage divider and a switch. The switch and clamp element 605 controlled by the switch driver 604 provides pulsed power at a fixed maximum current to the storage element 606. In the preferred embodiment the switch and clamp element is comprised of an N-MOSFET and a Zener diode, connected source to gate, limits/clamps the peak voltage, and therefore peak current, to a pre-selected peak voltage value. In one embodiment the preselected limiting voltage is determined by value of the Zener voltage of the Zener diode bridging gate to source of an N-MOSFET component of the switch 605. Power from the switch and clamp element comprised of pre-selected peak current pulse is provided to a storage element 606. In one embodiment the voltage regulator is comprised of a capacitor used as an energy storage element and a diode. Charge on the capacitor is fed back through a voltage divider circuit to the switch driver 604 thereby maintaining a constant charge on the capacitor. Output from the storage element is fed through a voltage regulator 607 to the load 608. In another embodiment the AC to DC converter further includes a galvanic isolation element 610. In another embodiment the AC to DC converter further includes elements 611 that enable feedback from the load 608. In the preferred embodiment the feedback circuit 611 also includes galvanic isolation between the control element 604 and the load 608.

FIG. 7 shows the preferred embodiment of the AC to DC converter. The AC source 601 is connected to the inrush protection circuit 601 comprised in this preferred embodiment of resistors R1 and R2. In another embodiment (not shown) the inrush protection includes switches such that the current flows through the resistors R1 and R2 at startup and bypasses the resistors once steady state operation is reached. In another embodiment the inrush control uses inductors; that is elements R1 and R2 are replaced with inductors L1 and L2. Output from the inrush protection goes to the switch Q2 of the switch and clamp circuit 605 and to the voltage sampling element 603. The voltage sampling element 603 is comprised of resistors R3, R4, R5 sampling the AC input and resistor R8 providing a feedback voltage from storage capacitor C1. The values of R3, R4, R5 and R8 are selected such that the voltage to the gate of switch Q1 in the switch driver element 604 turns switch Q1 on and off and thereby synchronously turns switch Q2 off and on thereby providing a preselected timed output pulse from switch Q2 to charge storage element C1. Resistor R8 provides a feedback path as to the charge on capacitor C1 and therefore the output voltage to the voltage sampling circuit 1303 and therefore to the control circuit 604. The switch and clamp element 605 is comprised of switch Q2, Zener Diode D1 and resistor R7. The switch Q2 is controlled by the switch driver circuitry 604. The peak output current of switch Q2 is clamped to a preselected value based upon the selected values of the Zener voltage of diode D1. Pulsed output from the switch Q2 is connected to the voltage regulator 606 which through the feedback of R8 to the voltage sampling 603 and the switch driver 604 holds capacitor C1 to a constant charge. Control element switch C1 and therefore supply switch Q2 are activated, either opened or closed, in synch with the AC input 601. The AC to DC converter provides a low voltage output with pulse modulation at the frequency of the incoming AC source. The switches are activated, either opened or closed, at voltages that are near, within the threshold values for the components Q1 and Q2, of the zero crossing of the AC source. The Output then goes to voltage regulator 607 and then load 608. The voltage regulator 607 includes switch Q3, Zener diode D3 resistor R9 and capacitor C2. Circuit components D3, Q3, R9 function as a voltage regulator. Capacitor C2 provides storage capacity to buffer and thereby smooth the output from the AC to DC converter to the load 608.

The AC to DC converter in the preferred embodiment of FIGS. 4 and 5 is comprised of elements of inrush protection 602, voltage sampling 603, a switch driver 604, a switch and clamp 605, a storage element 606 and a voltage regulator 607. Selection of components in the voltage sampling 603 determine the timing of the switch driver 604. Selection of elements in the switch and clamp determine a peak voltage and current for out pulses. Power output is controlled by selection of both the peak current and the pulse timing. Feedback from the storage element through the voltage sampling is used to select the pulse timing. The AC to DC converter operates in sync with the AC source. The preferred embodiment of FIGS. 6 and 7 include in general a voltage divider 603 connected to the power source 601, and, a first switch 604 connected through its input to the voltage divider, and, a second switch 605 whose input is connected to the output of the first switch, and, a storage capacitor C1 connected through a diode to the output of the second switch, and, a sense resistor connected 609 between the storage capacitor and the voltage divider thereby providing feedback control of the AC direct to DC extraction conversion system, and, a Zener diode D1 connected between the input and output of the second switch thereby clamping the voltage of the output and input of the second switch to the Zener voltage of the Zener diode, and, the electronic load 608 connected to the storage capacitor C1. The switches 604, 605 may be any electronically actuated switch. In one embodiment the switches are N-MOSFETs. In another embodiment the switches are bipolar transistors and in another embodiment the switches are microelectromechanical switches.

Bidirectional Switch

Figure 8:
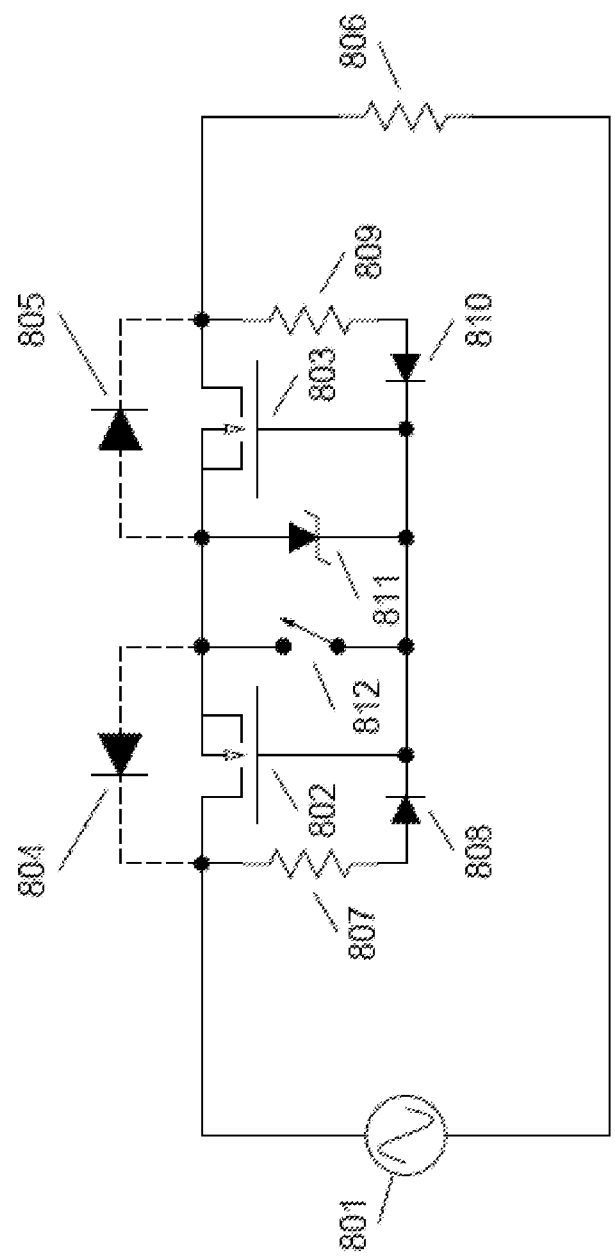
FIG. 8 shows a schematic for a bidirectional MOSFET switch used in some embodiments of the GFCI.

FIG. 8 is a schematic diagram showing the basic power MOSFET bidirectional switch 301, 302 controlling the power delivered from AC source 801 to load 806. Power MOSFETs 802 and 803 include body diodes 804 and 805, respectively. Zener diode 811 exhibits a Zener voltage greater than the threshold voltage, VT, of the power MOSFETs 802 and 803. Zener diode 811 is biased through rectifier diodes 808 and 810 connected at the drain terminals of the power MOSFETs and protected by current limiting resistors 807 and 809, respectively. Thus, when switch 812 is open, resistor-diode branches 807-808 and 809-810 provide bias for Zener diode 811 when either of the drain terminals exceeds the Zener voltage, thereby placing power MOSFETs 802 and 803 in the "on" state. When closed, switch 812 shunts the bias current from branches 807-808 and 809-810 to the source terminals of the power MOSFETS placing them in the "off" state. In this circuit the turn-on time constant is dictated by the value of the current limiting resistors 807 and 809 and the gate-to-source capacitance of the power MOSFETs, while the turn-off time constant is dictated by the MOSFET capacitances and the on-resistance of switch 812. Both of these time constants can be designed to be much shorter than the period of the AC mains, thereby allowing this embodiment to operate in both an on-off and a phase-control mode.

Figure 9:
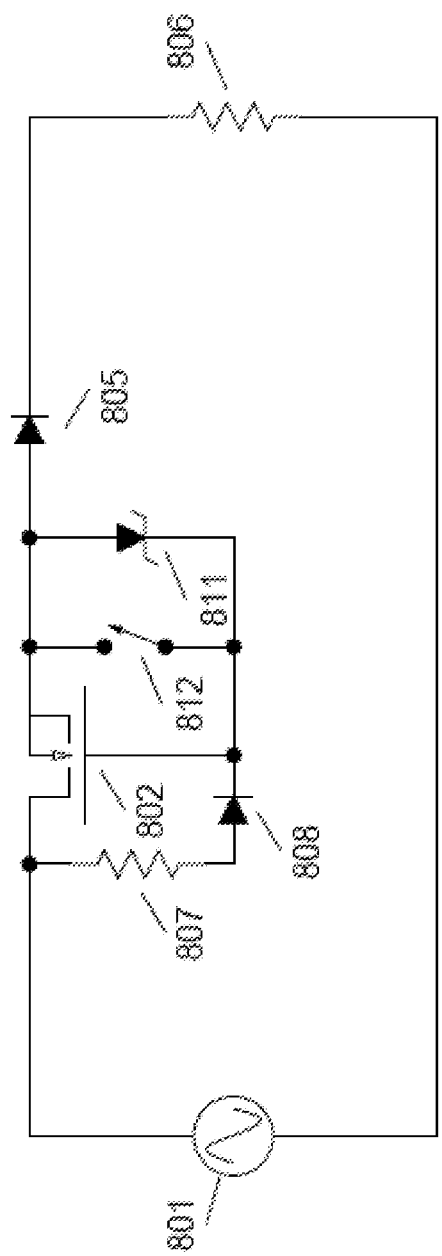
FIG. 9 shows the active components of FIG. 8 when the voltage source is in the positive half-cycle of the ac mains waveform

In practice, however, the Zener diode 811 never reaches its Zener voltage, and the gate-source voltage of MOSFETs 802 and 803 rarely exceeds the threshold voltage, VT. Thus, neither MOSFET 802 or 803 is fully "on" resulting in excess power dissipation in the units and reduced current supplied to the load 806. FIG. 9 shows the active components of FIG. 8 when the voltage source 801 is in the positive half-cycle of the ac mains waveform. When switch 812 opens to allow MOSFET 802 to enter its "on" state, the gate voltage of MOSFET 802 begins to follow the positive excursion of source 801 while the source voltage is at zero volts. When the gate voltage reaches the threshold voltage of MOSFET 802, current begins to flow to load 806 and body diode 805 from MOSFET 803 is forward biased. The source voltage of MOSFET 802 then "follows" the rise in the gate voltage, lagging it by the value of the threshold voltage plus an additional bias to account for the current supplied to the load. This condition is maintained until the waveform of source 801 becomes negative. Consequently, the drain-to-source voltage of MOSFET 802 never falls below its threshold voltage, regardless of the drain-to-source resistance of the device, and the power dissipated in the switch is $I_D * V_T$. If the gate voltage can be boosted well beyond the threshold voltage, the dissipated power is given by $I_D^2 * r_{ds}$, where $r_{ds}$ is the "on" resistance of the switch. This value can be much smaller than $I_D * V_T$.

Figure 10:
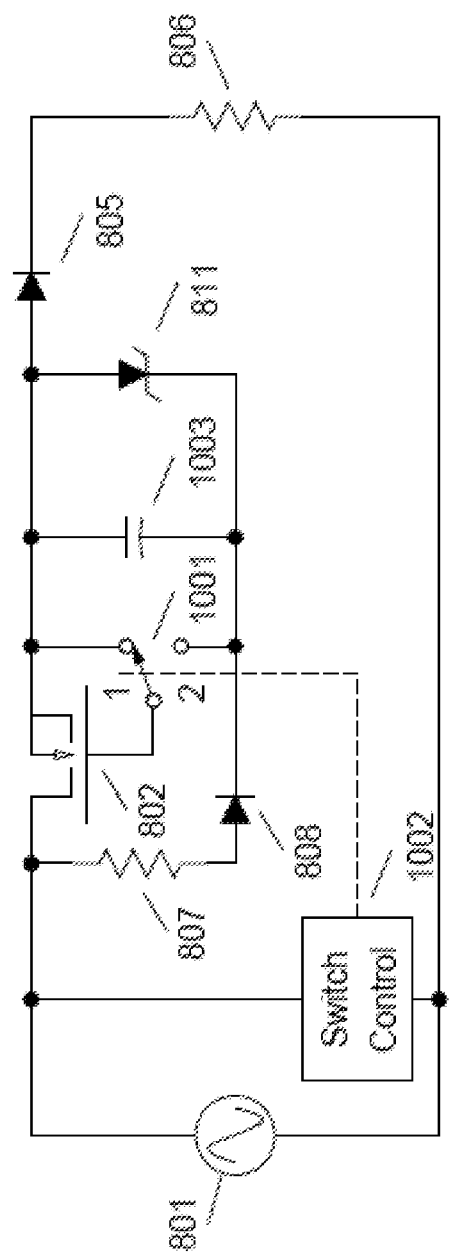
FIG. 10 shows a schematic of the half switch shown in FIG. 9 that allows a boost of the gate voltage.

FIG. 10 shows a schematic of the half switch shown in FIG. 9 that allows a boost of the gate voltage. It differs from the circuit of FIG. 9 in the replacement of switch 812 with a 2-pole switch 1001 which allows the gate of MOSFET 802 to be connected either to its source or to the bias circuit 807-808. The bias circuit also includes capacitor 1003 connected in parallel with Zener diode 811. Switch 1001 is controlled by Switch Control circuit 1002 that maintains the switch 801 in either position 1, corresponding to MOSFET 802 set in its "off" condition, or in position 2, which connects the gate to the bias circuit. Switch Control circuit 1002 is designed to keep switch 1001 in position 1 until the AC source 801 waveform exceeds a pre-established trigger level, $V_{trig}$, whereupon it switches 1001 to position 2. Thus, switch 1001 and Switch Control circuit 1002 keep MOSFET 802 in its "off" state until the AC voltage waveform reaches the trigger level, $V_{trig}$, which allows the bias circuit to charge to $V_{trig}$ while the source of MOSFET 802 remains at 0 volts. When switch 1001 changes state, the bias voltage, $V_{trig}$, is applied to the gate which value can be much larger than the threshold voltage, VT. The source of MOSFET 802 begins charging towards $V_{trig}$-VT, and part of this voltage step is coupled to the gate through capacitor 1003. This increases the gate bias well beyond $V_{trig}$ so that it exceeds the AC source 801 voltage value. Thus, MOSFET 802 reaches a state where the drain-to-source voltage is nearly zero, while the gate-to-source voltage is larger than $V_{trig}$. In this state MOSFET 802 exhibits its minimum channel resistance, $r_{ds}$, and maximum voltage appears across load 806.

Figure 11:
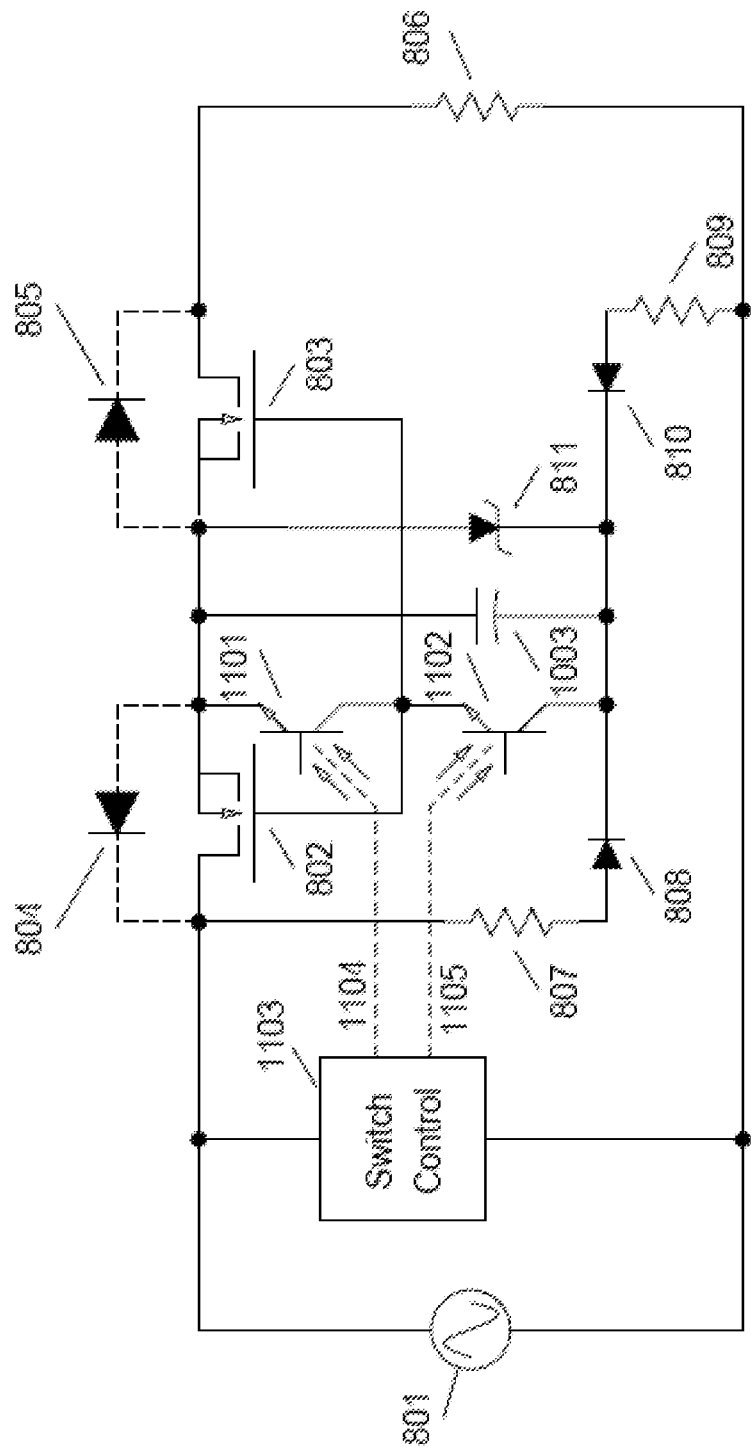
FIG. 11 illustrates an embodiment of the circuit of FIG. 10 in a fully bidirectional switch configuration.
Figure 12:
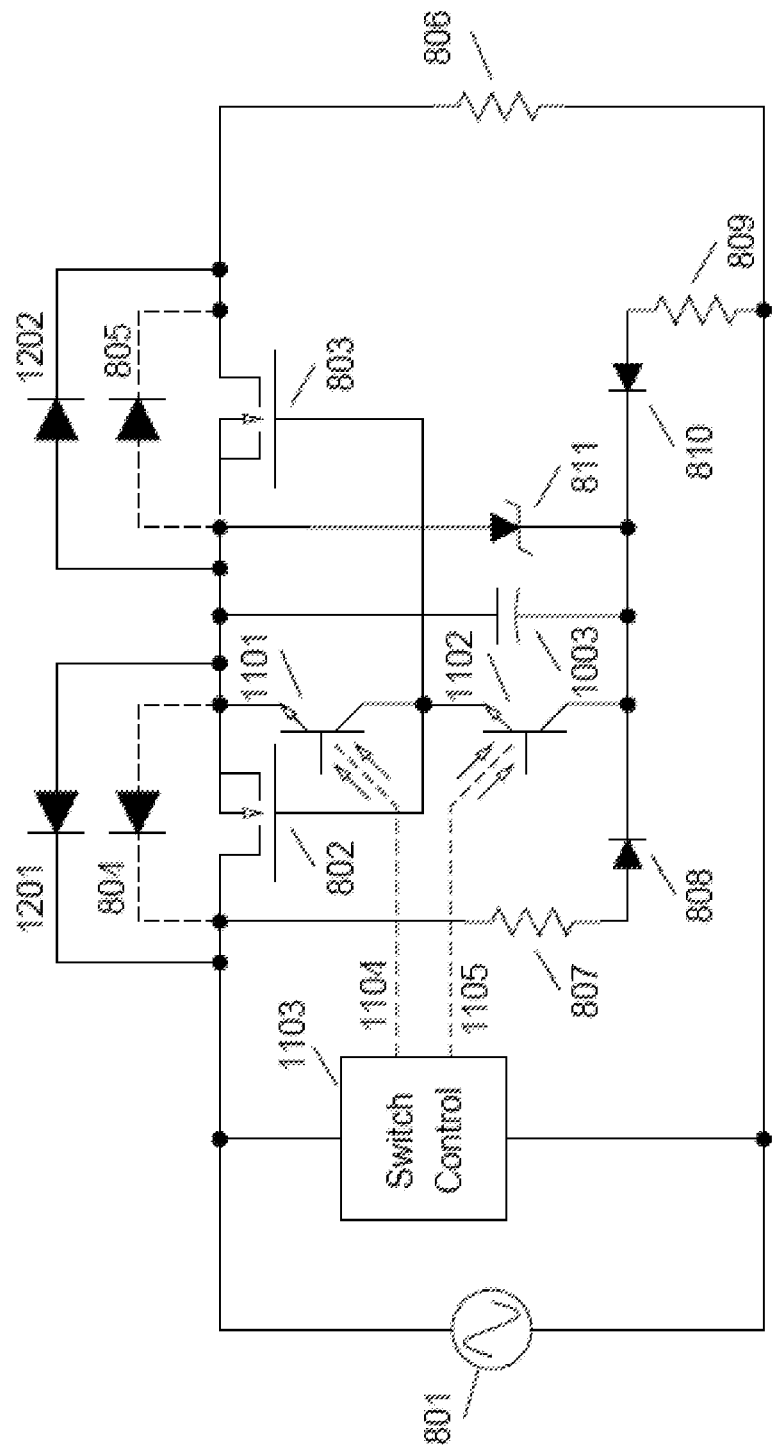
FIG. 12 shows an embodiment of the bidirectional switch of FIG. 11 that further includes bypass diodes.

FIG. 11 illustrates an embodiment of the circuit of FIG. 10 in a fully bidirectional switch configuration. Switch 1001 is replaced with a pair of electronic control switches 1101 and 1102 that are controlled by an expanded Switch Control circuit 1103 having outputs 1104 and 1105 that drive 1101 and 1102, respectively. In the preferred embodiment, the switches 1101, 1102 are optical transistors. As in FIG. 10, the Switch Control circuit is characterized by a trigger level, Vtrig, that provides optical excitation via output 1104 if the absolute value of the AC mains source voltage level is less than Vtrig, and via output 1105 otherwise. The switch control is programmed such that the optical drive signals 1104, 1105 do not overlap, thereby providing a "break before make" switch characteristic and avoids discharging capacitor 1003 prematurely. In another embodiment shown in FIG. 12, the bidirectional switch of FIG. 11 further includes bypass diodes 1201, 1202 which can bypass the intrinsic diodes 804, 805 of the MOSFETs 802, 803. All other components are consistently numbered and as discussed in previous FIGS. 8-11.

Figure 13:
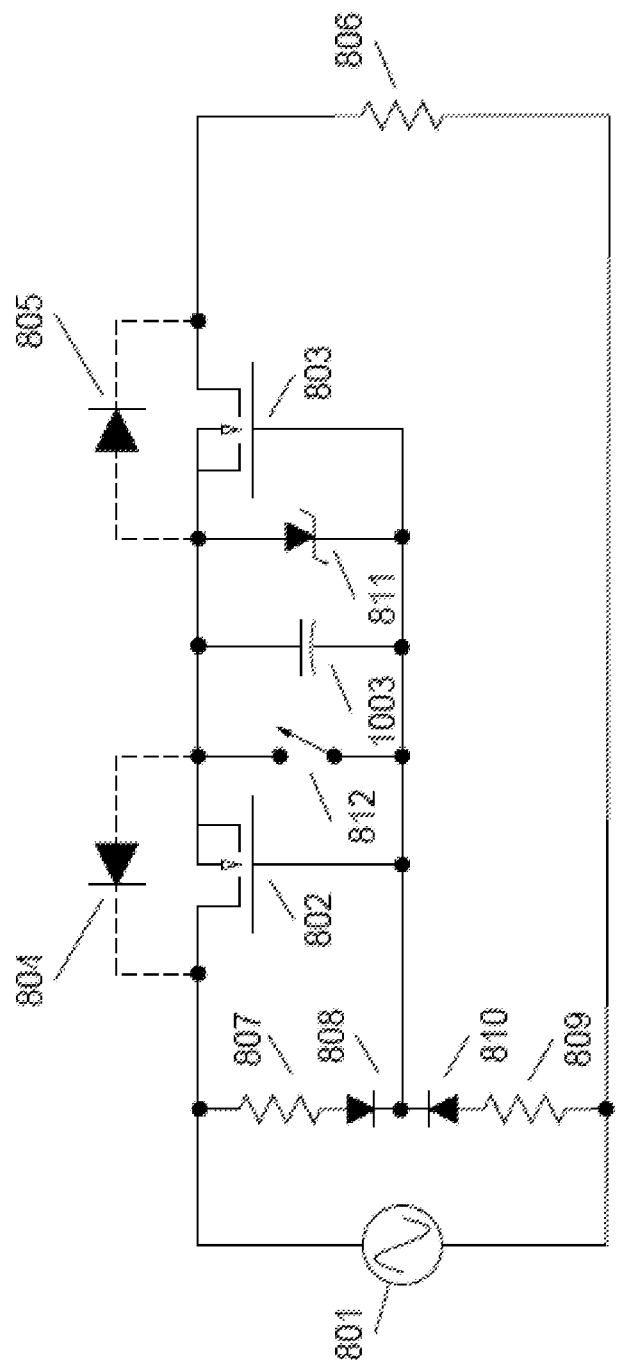
FIG. 13 shows another embodiment of a solid state bidirectional switch.

FIG. 13 shows a further improved version of the circuit of FIG. 8 where the branch including diode 810 and bias resistor 809 is moved from the drain of MOSFET 803 to the AC mains neutral line. This configuration avoids the clamping action that occurs for the configuration of FIG. 6 and allows Zener diode 811 to reach its Zener voltage, $V_z$, when the source of MOSFET 803 falls to $-V_z$. This causes the gate-to-source voltage of MOSFET 803 to be $V_z$ which can be significantly larger than VT, thereby exhibiting a small value of $r_{ds}$ and decreasing power dissipation. Furthermore, this boosted gate-to-source biased is stored on the gate-to-source capacitances of MOSFETs 802, 803, and is maintained during the subsequent positive half-cycle of the ac mains waveform. Thus, both devices remain in minimum $r_{ds}$ configurations until switch 812 closes. Bias elements 807 and 808 are maintained to improve the initial turn-on characteristics during a positive half-cycle, and an additional capacitor 1003 in parallel with the gate-to-source capacitances of MOSFETs 802, 803 is included to make the storage of the boosted gate-to-source bias voltage more robust.

One limitation of this embodiment occurs when the switch circuit is being used in a phase-control mode wherein switch 812 is closed for a predetermined period during each cycle of the ac mains waveform. Since capacitor 1003 is discharged through switch 812 while it is closed, the gate-to-source bias required to turn MOSFETs 802, 803 "on" must be re-established during each cycle. This results in MOSFET 802 always operating in a suboptimal mode if switch 812 opens during the positive half cycle of the ac mains waveform since the boost provided during the negative half cycle is reset when switch 812 closes.

Figure 14:
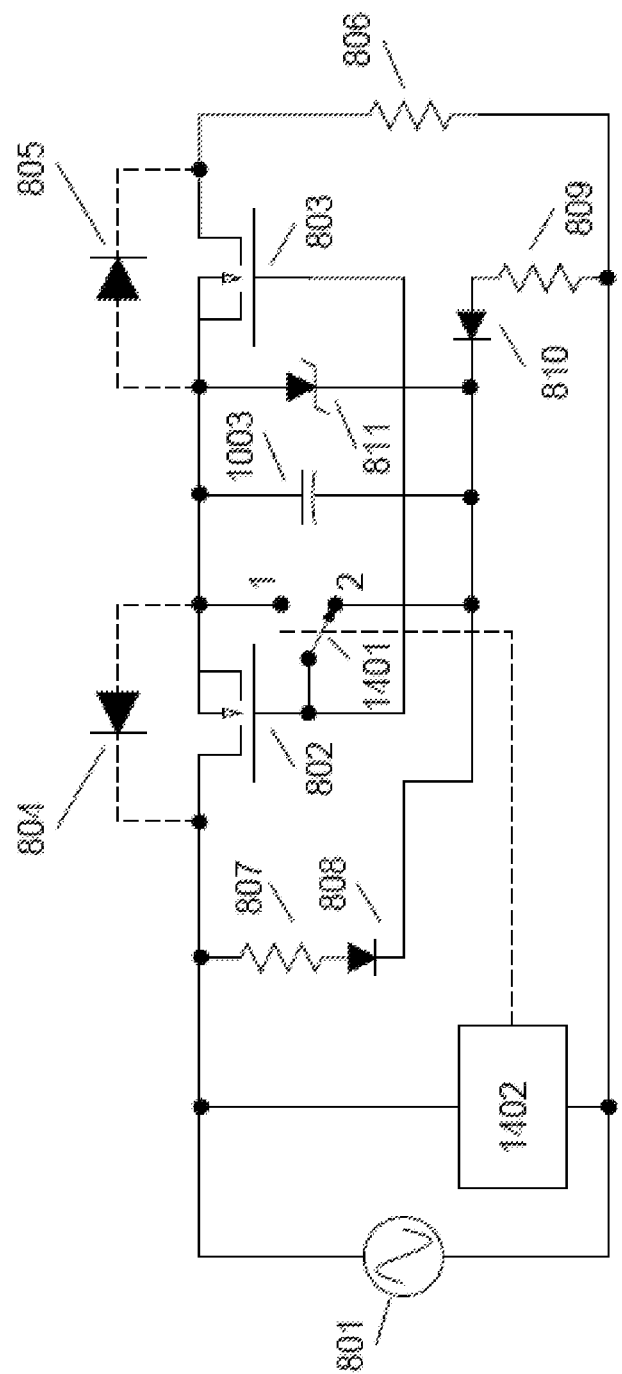
FIG. 14 shows a third embodiment of a solid state bidirectional switch.

FIG. 14 shows an embodiment of the circuit of FIG. 11 in which switch 812 is replaced with dual-pole switch 1401 that connects the gates of MOSFETs 802 and 803 either to their interconnected sources when in position 1 or to the Zener diode bias circuit when in position 2 which positions are determined by Switch Control circuit 1402. In this embodiment, placing switch 1401 in position 1 to turn MOSFETs 802 and 803 "off" disconnects the Zener diode bias circuit from the gates thereby allowing capacitor 803 to store the Zener voltage until either it is discharged through the external circuitry or until switch 1401 is placed in position 2, resulting in re-application of the stored Zener voltage to the gate circuit and the subsequent refreshing of the gate-to-source bias voltage during a negative half-cycle.

Figure 15:
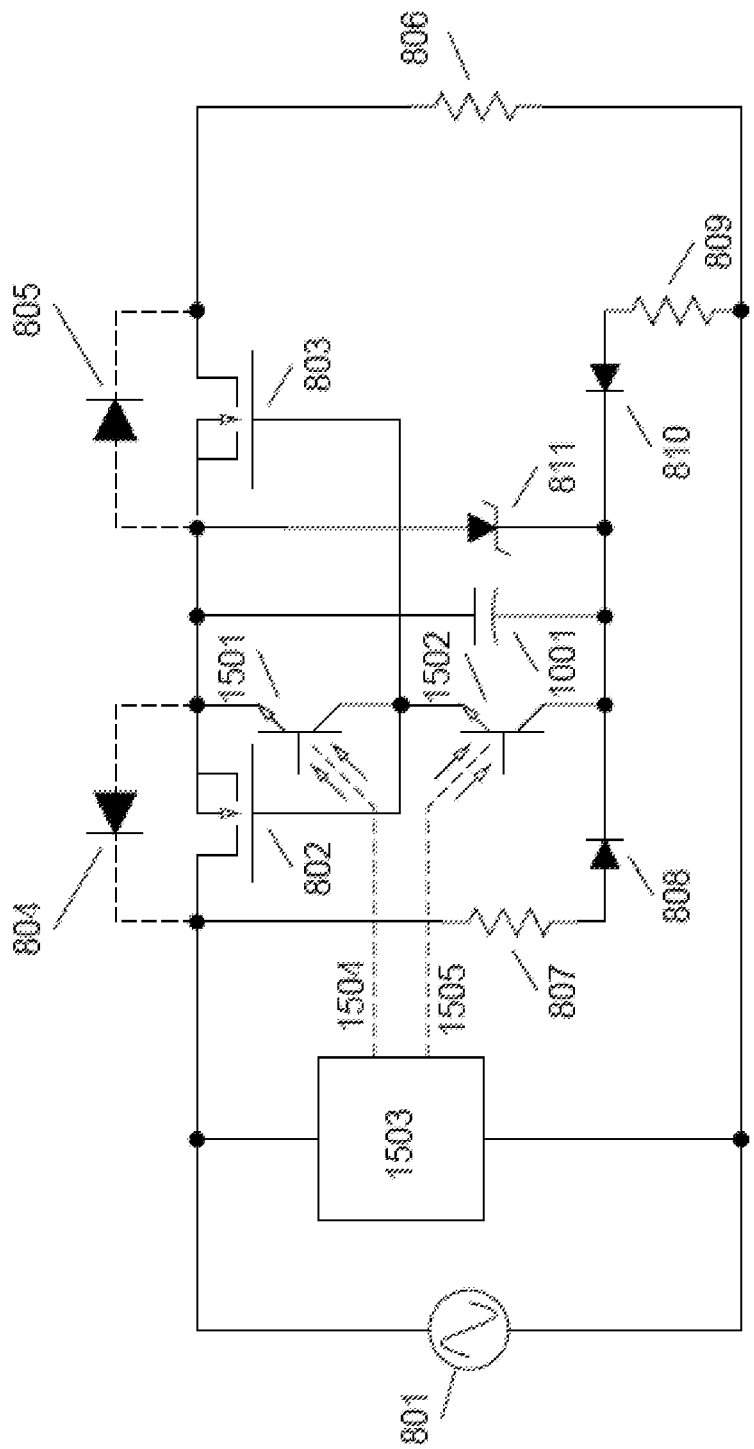
FIG. 15 shows an embodiment of an optically activated bidirectional switch.

FIG. 15 illustrates an embodiment of the circuit of FIG. 14 wherein switch 1401 is replaced with a pair of phototransistors 1501 and 1502 that are controlled by a Switch Control circuit 1503 having optical outputs 1504 and 1505 that drive 1501 and 1502, respectively. The Switch Control circuit 1503 synchronizes outputs 1504 and 1505 to the AC mains waveform to provide the phase-control mode capability. It is important that these optical drive signals not overlap, thereby providing a "break before make" switch characteristic to avoid discharging capacitor 803 prematurely.

The time constant for the switch control allows for the rapid switching of the optical drive signals in synchronism with the AC mains waveform through external control circuitry (not shown) to provide phase control of the applied AC waveform, as is used in dimmer applications. In another embodiment the control signal is a train of pulses synchronized with the AC mains waveform and having adjustable pulse widths to effectively control the average current/power delivered to the load, thereby providing a dimming effect for a light source load and a speed control for an AC motor load. In another embodiment the control signal is a train of pulses having a fixed or variable frequency independent of the AC mains waveform thereby generating a radio-frequency (RF) power waveform at the load terminals for use as a wireless charger/generator. In another embodiment the control signal is a variable DC voltage allowing variable illumination of the LED thereby allowing the MOSFETs to operate in a linear mode.

In a preferred embodiment the switch control circuit receives a control signal from a control signal source, and the switch control circuit optical drive signals are pulsed in synchronism with the AC power source to provide phase control of the AC power to the load. In another embodiment, the optical drive signal is a train of pulses synchronized with the AC mains waveform and having adjustable pulse widths to effectively control the average current/power delivered to the load, thereby providing a dimming effect for a light source load and a speed control for an AC motor load.

Figure 16:
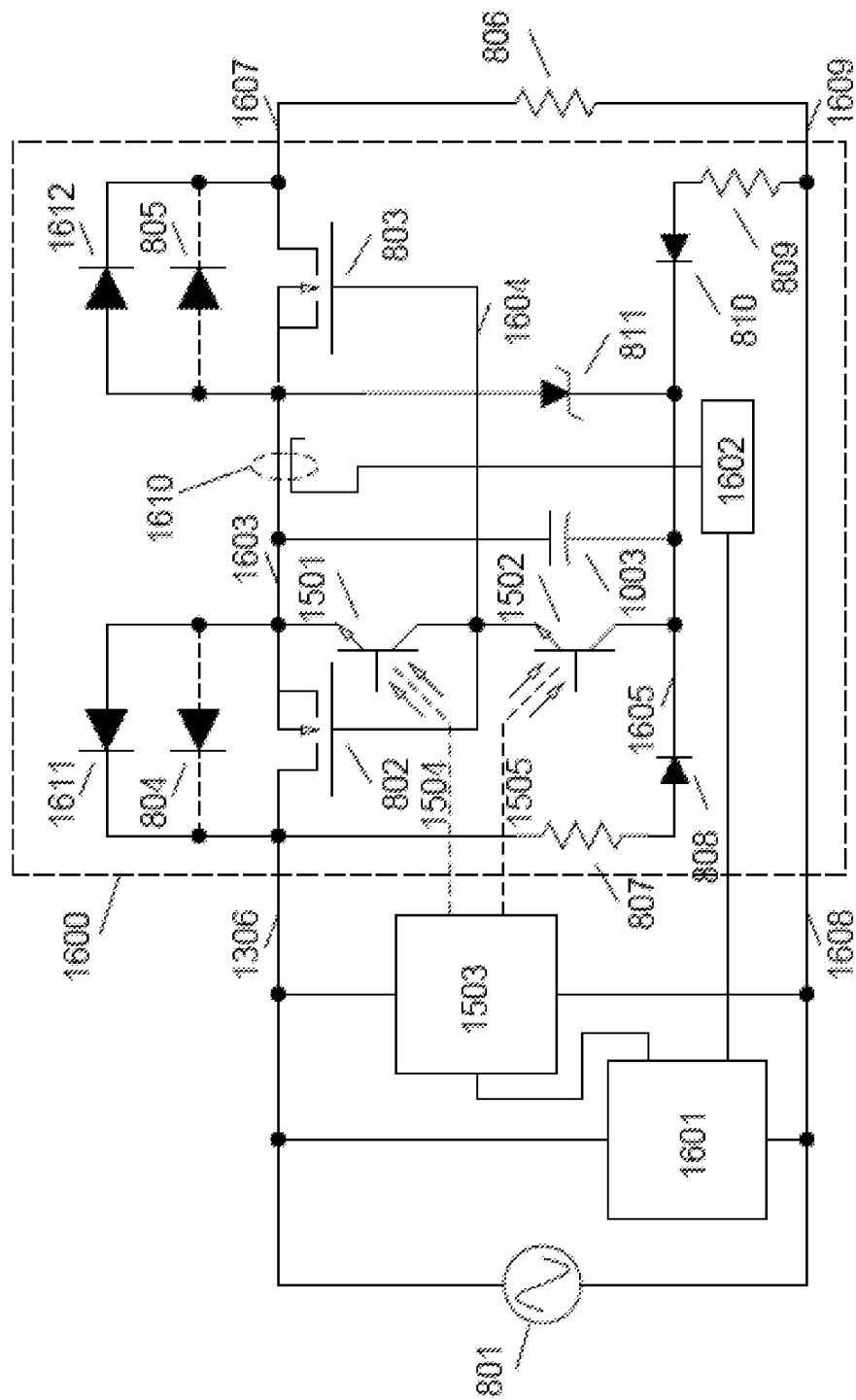
FIG. 16 shows a preferred embodiment of an optically activated bidirectional switch.

In another embodiment shown in FIG. 16 power to the switch control 1503 is provided by a low voltage AC to DC converter 1601. The AC to DC converter is in turn controlled by a current sensor 1602 which employs current sensor 1610 to sense the AC current delivered to load 806 such that the AC to DC converter and therefore the Switch control are turned off if no current is sensed in the bi-directional switch comprised of MOSFETs 802, 803. In this embodiment the bidirectional switch of FIG. 15 further includes bypass diodes 1611, 1612 which can bypass the intrinsic diodes 804, 805 of the MOSFETs 802, 803. All other components are consistently numbered and as discussed in previous FIGS. 8-15.

Figure 17:
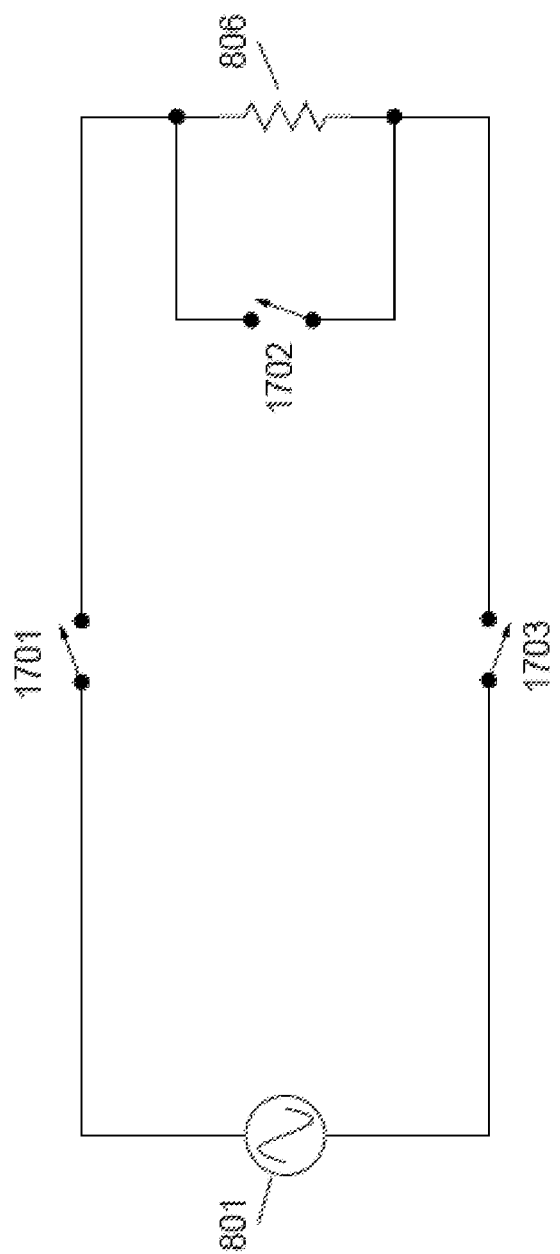
FIG. 17 shows a GFCI including a third switch that bypasses the load.

In another embodiment shown in FIG. 17, bidirectional switches 1701-1703, as described above are located between the source 801 and the load 806 and included in the line 1701 and the neutral 1703 as well as a bidirectional switch 1702 that bypasses the load 806. Switch 1702 is closed when switch 1701 is open.

To summarize, the solid state bidirectional switch 1600 comprises: first and second series connected electronic switch devices 802, 803, each switch device having a drain terminal, a source terminal and a gate terminal and being characterized by a threshold voltage specified between the gate terminal and the source terminal, wherein the drain terminal of the first switch device comprises the first input terminal 1606 of the solid state bidirectional switch and drain terminal of the second switch devices comprise the first output terminal 1607 of the solid state bidirectional switch. Second input terminal 1608 and second output terminal 1609 are interconnected. The source terminals of the first and second switch devices are interconnected at a first control terminal 1603 and the gate terminals of the first and second switch devices are interconnected at a second control terminal 1604, and, a first control switch 1501 connected between the first control terminal and the second control terminal, and a bias terminal 1605 connected to the second control terminal through a second control switch 1502, and a voltage regulator device 811 connected between the bias terminal and the first control terminal, and a capacitor 1003 connected in parallel with the voltage regulator device, and a first rectifier device 808 connected from the first input terminal 1606 of the switch circuit to the bias terminal through a first current limiting resistor 807, and, a second rectifier device 810 connected from the second output terminal 1609 of the switch circuit to the bias terminal through a second current limiting resistor 809, and, a switch control circuit 1503 that controls the first control switch and the second control switch, such that first control switch is closed when the second control switch is open and vice versa.

Load Identifying Sensor

Figure 18:
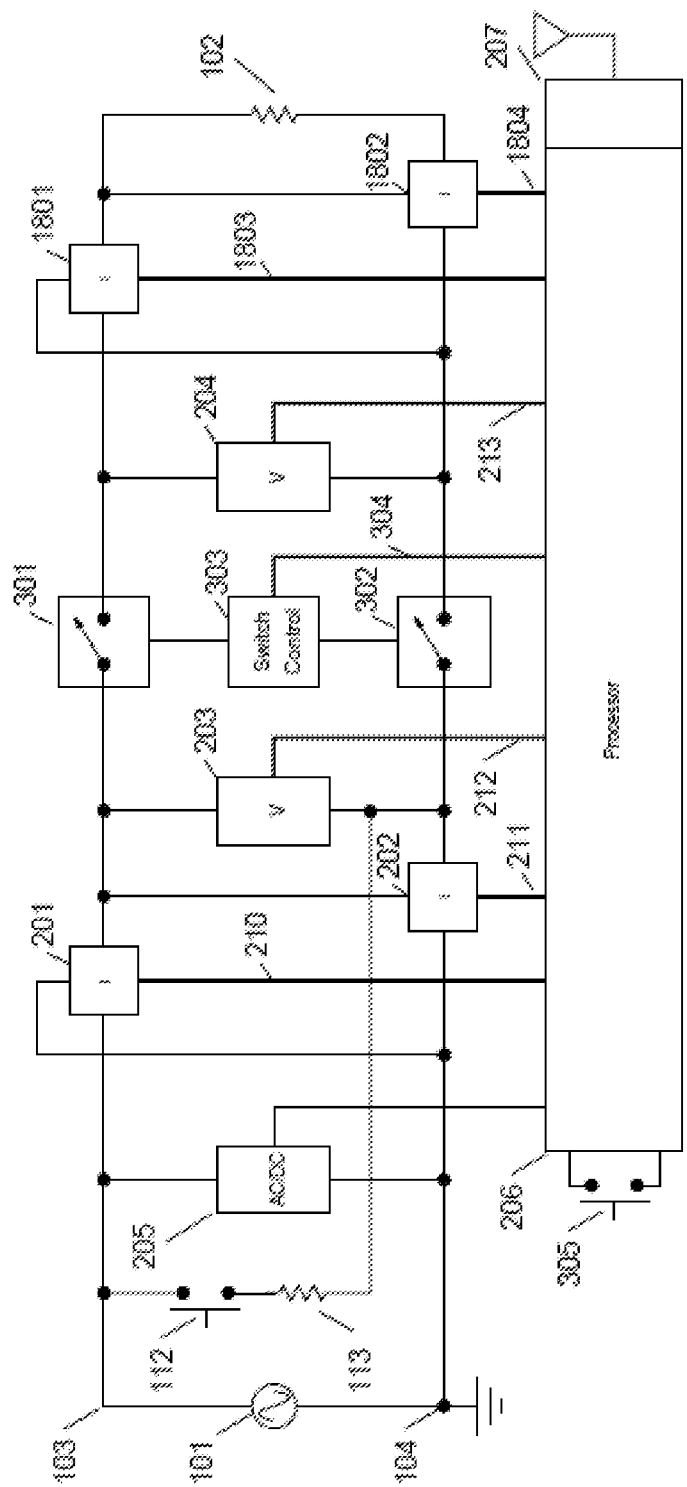
FIG. 18 shows a preferred embodiment of the GFCI including load identification and arc fault detection.
Figure 19:
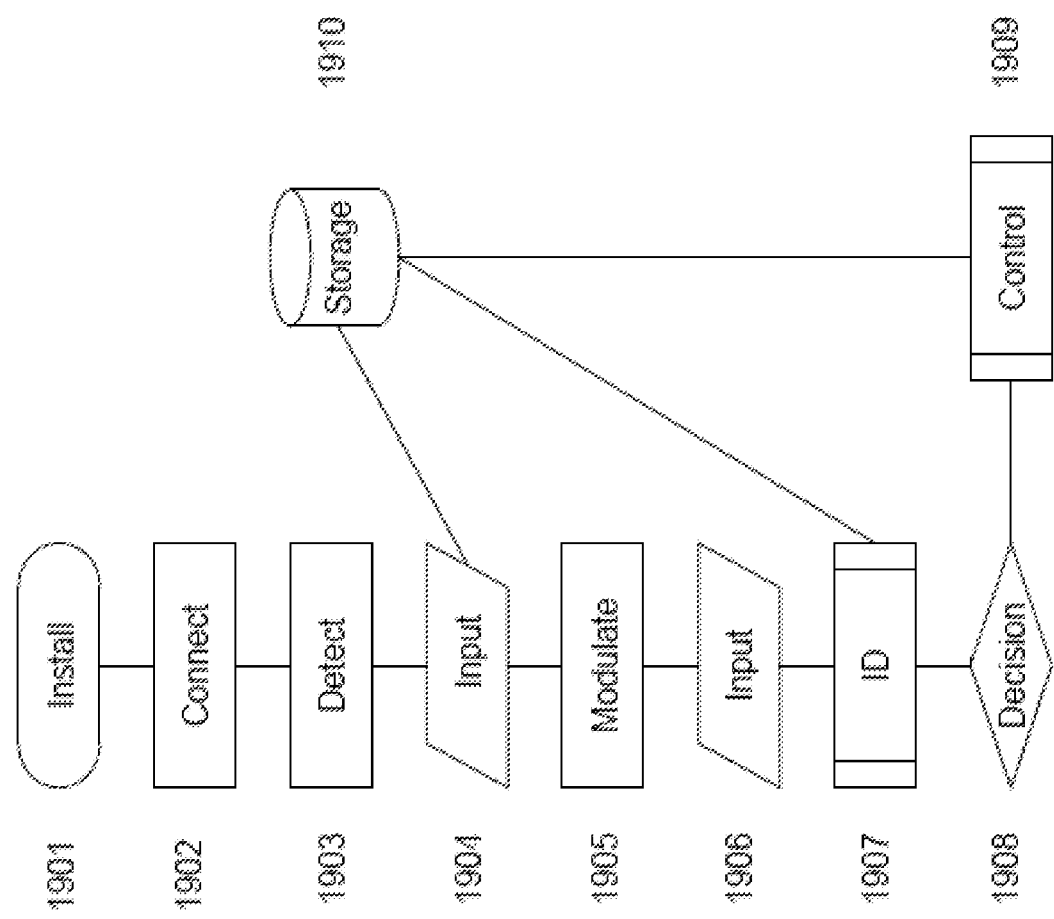
FIG. 19 is a flow chart for a method to use the circuit of FIG. 18.

In a further embodiment of the GFCI the set of sensors includes sensors to allow the identification of the type of load and to control the load on the basis of the identification. FIG. 18 shows a modification to the GFCI circuit shown earlier in FIG. 3 that includes additional sensor components to accurately identify the type of load connected to the AC electrical supply 101. FIG. 19 shows a method to use the circuitry of FIG. 18.

The components in various embodiments of the load identifying GFCI are seen in FIG. 18 and are identical to those discussed with respect to FIG. 3 with the addition of current sensors 1801 and 1802. The additional current sensors are located adjacent to load 102 to provide a more accurate measure of the load current, and they communicate with microprocessor 206 via bidirectional digital busses 1803 and 1804. The voltage sensors 203, 204 and current sensors 201, 202, 1801, 1802 are as those known in the art and include voltage sensors using resistive dividers and current sensors employing current-sensing resistors and associated differential amplifiers, or Hall Effect sensors. The analog sense signals are typically processed by comparators or A/D converters and the digitized signals stored in data storage elements that include random access memory, read only memory and other solid state memory and non-solid state memory devices as are known in the art. The Microprocessor includes components known in the art and associated with microprocessors including user interfaces to allow actuation and programming of the microprocessor, memory for storage of data and input and output ports for receiving data and sending control signals respectively. In one embodiment the input/output ports include means to access other computing devices such as handheld computing devices and remote servers. The microprocessor is programmed to effectuate the steps described in FIG. 19 below. Aspects of the microprocessor may be located remote from some components of the load identifying GFCI. As a non-limiting example data storage of a library of data may be stored remotely and accessed by wired or wireless means such as through an Internet connection. Similarly, some computation, such as a neural network analysis of the load data may be accomplished on a remote server and the results sent to the microprocessor 206. The switches 301, 302 and switch controller 303 are controlled by the microprocessor 206. The details of the switch and switch controller in preferred embodiments are shown and discussed in FIGS. 8-17.

In one embodiment the AC/DC converter 205 may be of any type known in the art that would supply a voltage and power suitable for a microprocessor, sensors and switch control. Such an AC/DC converter would include rectifier and transformer components to provide a selected voltage and power as required by sensor and microprocessor circuitry. Similarly, the switches 301, 302 and controller 303 can be any switch/controller known in the art that can be programmably operated at frequencies required for features, such as phase angle modulation, as already described. Non-limiting further examples include triacs known to be used for phase angle modulation as well as solid state switches such as MOSFETs and other solid-state switch devices as well as microelectromechanical (MEM) devices. In the preferred embodiment the components of the load identifying GFCI are selected such that the entire device of FIG. 18, except the AC mains 101 and the load 102, are integrated on silicon. In a preferred embodiment the AC/DC converter 205 is as described in FIGS. 6 and 7 and the switches 301, 302 and controller 303 are as described in FIGS. 8-17 and the entire load identifying GFCI is integrated onto silicon.

The waveforms of the AC mains and the voltage and current across and through the load as detected by current sensors 201, 202, 1801, 1802 and voltage sensors 203, 204 are recorded and analyzed at a sampling frequency that is significantly greater than the cycle time of a single period of the AC mains. The sampling frequency of the voltage and current wave forms are selected as required to distinguish load types. In one embodiment the sampling frequency is at a kilohertz range. In another embodiment the sampling frequency is at a megahertz range. In a preferred embodiment, the programmed variation of the power applied to the load is selected so as to optimize differentiation in the acquired waveforms between anticipated load types. In one embodiment analysis of the waveforms includes matching patterns in the high frequency components of the voltage and current waveforms from the load. In another embodiment analysis of the wave forms includes determining a delay in timing of the load drawing power after power is first applied to the load. In another embodiment analysis means classifying the acquired waveforms, including high frequency components thereof, into groups that are indicative of different load types. Non-limiting examples of groups include waveforms indicative of a primarily resistive load, a capacitive load, an inductive load, loads that include power factor correction, and, loads that include power control such that there is a delay in the power to the load at initial application of power form the source.

Referring now to FIG. 19, a method for using the load control circuit and components as described in FIGS. 2-18 is shown. A load control appliance is installed 1901. In one embodiment installation includes electrically connecting the load control device including the circuit of FIG. 18 between the AC mains supply and the load. In one embodiment this installation includes installing the load control device in the junction box. In another embodiment the installation includes installing the load control device in a wall outlet. In another embodiment installation includes installing the load control device as an electronic supply strip or smart extension cord by plugging the load control device into a conventional wall outlet and the load is to be plugged into the load control device. Once the load control device is installed 1901, a load is attached to the load control device 1902. The load control device detects the load 1903 and power is supplied to the load by activating the switch within the load control device. The switch and the details of the load control device are shown in subsequent Figures. Once load is detected, data acquisition 1904 is initiated. Data acquisition includes recording timing as to when the load is connected to power, when power is applied to the load and when power is used by the load. Data acquisition further includes acquiring waveform data. Any data acquired once a load is detected that is specific to a load is termed "load data". Load data includes the turn on timing of the load as well as waveform data. Waveform data includes acquiring values of the AC main voltage, the load voltage, the load current and the power consumed by the load as a function of time. All are acquired at a frequency optimized for detection of the type of load. In one embodiment data is acquired at a frequency that is a multiple higher than the frequency of the AC mains source. In one embodiment data for a 50 to 60 cycle AC source data is acquired at a kilohertz rate. In another embodiment that relies upon high frequency components of the voltage and current waveforms for identification of the load, data is acquired at a megahertz rate. Acquired load data is stored 1909 for analysis. In one embodiment storage includes storage in short-term random-access memory of a microprocessor for immediate or nearly immediate processing. In another embodiment storage includes storage in long term memory such that the stored load data is used for subsequent pattern matching to identify the identical or similar loads based upon matching of the waveform patterns obtained at first connection of a load 1902 (i.e. first pass through the indicated flow chart) with connection of the same or different loads at later times. In one embodiment the storage 1909 includes storage that is accessible by a plurality of load control devices. Such storage is accessible by devices that are wired or wirelessly connected to the load control GFCI or by transfer of the stored load data from a first load control GFCI to a second load control GFCI. Once connected 1902 and detected 1903 and after initial data acquisition 1904, the power to the device is modulated 1905. Modulation means varying the power to the device using a programmable switch. Further load data is acquired 1906 both during and after modulation and the load is then identified 1907 on the basis of the load data. In one embodiment identification is on the basis of comparing the waveforms of the load data with previous acquired waveforms in load data of known load devices. In another embodiment the load is identified on the basis of both the timing around the turn on of the power to the load, as already discussed, and matching of the wave form data. In another embodiment a neural network analysis is used to classify the load data into a category of load types by comparison with a library of prior load data. In another embodiment identification of the load means classifying the load into a particular category of load based upon the phase relationship between the load voltage and current wave forms and the AC mains voltage wave form both before, during and after modulation of the power to the load using the series switch. In one embodiment the load is identified 1907 as one of:

1. Pure Resistive Load. Voltage and current zero crossing and peak synchronously both before during and after modulation of the supply voltage. Power is reduced when voltage is reduced, power returns to pre-modulation level when modulation of supply voltage is stopped, and, supply voltage returns to full voltage.
2. Constant power Resistive load with power correction. Voltage and current peak synchronously before modulation, Power is constant before, during and after modulation,
3. Pure Reactive (capacitive or inductive) load. Voltage and current are out of phase before, during and after modulation, Power is reduced during modulation of the supply voltage, Power returns to pre-modulation level when modulation of supply voltage ends and returns to full voltage.
4. Constant Power Reactive load. Voltage and current are out of phase before, during and after modulation, Power is constant before, during and after modulation of the supply voltage.

In one embodiment the modulation of the supply voltage results in a reduction of the RMS supply voltage by an amount an amount between 1 and 20%.

In one embodiment identification 1907 further includes determining a confidence level for the identification. In one embodiment the confidence level is determined by the goodness of fit of a match of the load data obtained during the data acquisition steps 1904, 1906 with data obtained previously on known loads and stored 1910. Once the identification step 1907 is complete the system further checks 1908 whether the load has been identified and whether there are control rules associated with the load identification. In one embodiment the check 1908 on identification is done by comparing a confidence level in the identification with a pre-selected confidence level defined as positive identification. If the load is positively identified and there are pre-selected control rules associated with the identified load, then control 1909 of the load is implemented. In the preferred embodiment the power to the load is then controlled by the switch in series with the load. Non-limiting examples of pre-selected control rules include:

1. During daylight hours, a pure resistive load such as a light bulb is dimmed to reduce power usage, especially during peak demand.
2. In constant power load when load demands dropped the input power will drop accordingly to minimize the power consumption of no load/minimum load requirements.
3. In remote location (no human presence) a pure resistive load and a constant power resistive load will be disconnected and reconnected automatically by the demand of the load
4. Devices that produce an arc during normal operation (e.g. an electric motor having brush connections to the rotor) are ignored by an arc fault circuit interrupter to prevent nuisance disconnects.

In another embodiment there are a pre-selected set of rules based upon whether the load is one selected from: a pure resistive, a constant power resistive, a pure reactive and a constant power reactive. In one non-limiting example of pre-selected rules loads identified as having an included power factor correction, that is constant power loads, are not turned off by the controller and a pure resistive loads are turned off during pre-selected periods of time and power to pure reactive loads is reduced during pre-selected periods of time.

In another embodiment, the GFCI is actuated and the load is disconnected from the power supply when the microprocessor detects a difference in the current through the hot and neutral lines exceeds a first pre-selected limit. In another embodiment, the GFCI is actuated and the load is disconnected from the power supply when the microprocessor detects a current through the hot line exceeds a second pre-selected limit. In another embodiment the first pre-selected limit and the second pre-selected limit are automatically selected by the microprocessor based upon identification of the type of load.

Fault Detection Sensor

In another embodiment the sensor array includes fault detection sensors. The sensors detect both ground fault and arc fault failures in the load circuitry and control power to the load on the basis of fault detection.

Figure 20:
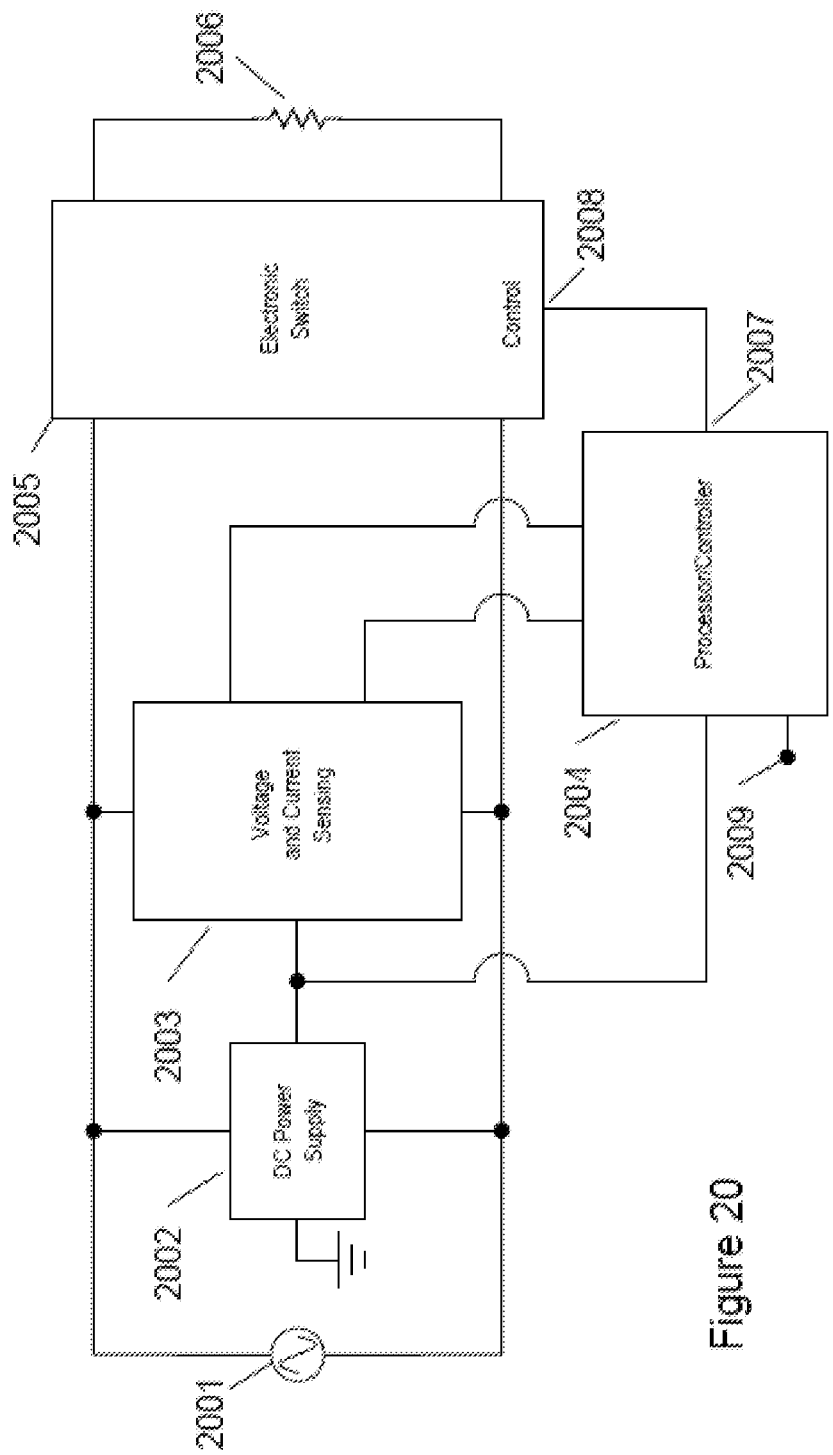
FIG. 20 is a block diagram showing the key elements of a solid-state circuit interrupter.

FIG. 20 is a block diagram showing the key elements of the solid-state electrical-fault circuit interrupter. AC mains 2001 is connected to load 2006 through electronic switch unit 2005. A low voltage DC power supply 2002 efficiently provides power for mains voltage and current sensing circuit 2003 and the fault detection processor 2004. Sense inputs to the fault detection processor 2004 are provided from the voltage and current sensing circuit 2003. The solid-state sensing circuit comprising sensors that sense the waveforms of the voltage and current applied to the load circuit, and, develop proportional analog waveforms. The fault detection processor processes the proportional analog waveforms and upon detection of either a ground fault or an arc fault generates a fault output 2007. Upon detection of a fault, the Fault output 1807 of the fault detection processor 2004 is latched and fed to the control input 2008 of electronic switch 2005 which disconnects the load 2006 from the mains 2001 until a reset 2009 is applied to the fault detection processor 2004. In another embodiment the output voltage of the Electronic Switch 2005 can be varied through the control circuit 2008. In this embodiment upon detection of an arc fault, the output voltage can be reduced to a value that is less than a threshold for arcing yet greater than zero. Such an embodiment allows the load circuit to continue operation at a reduced voltage while reducing the chance for a damaging arc. The operation at reduced voltage also allows for continued characterization of the load and mains supply circuit to determine the location of an arc fault for subsequent replacement or repair.

Figure 21:
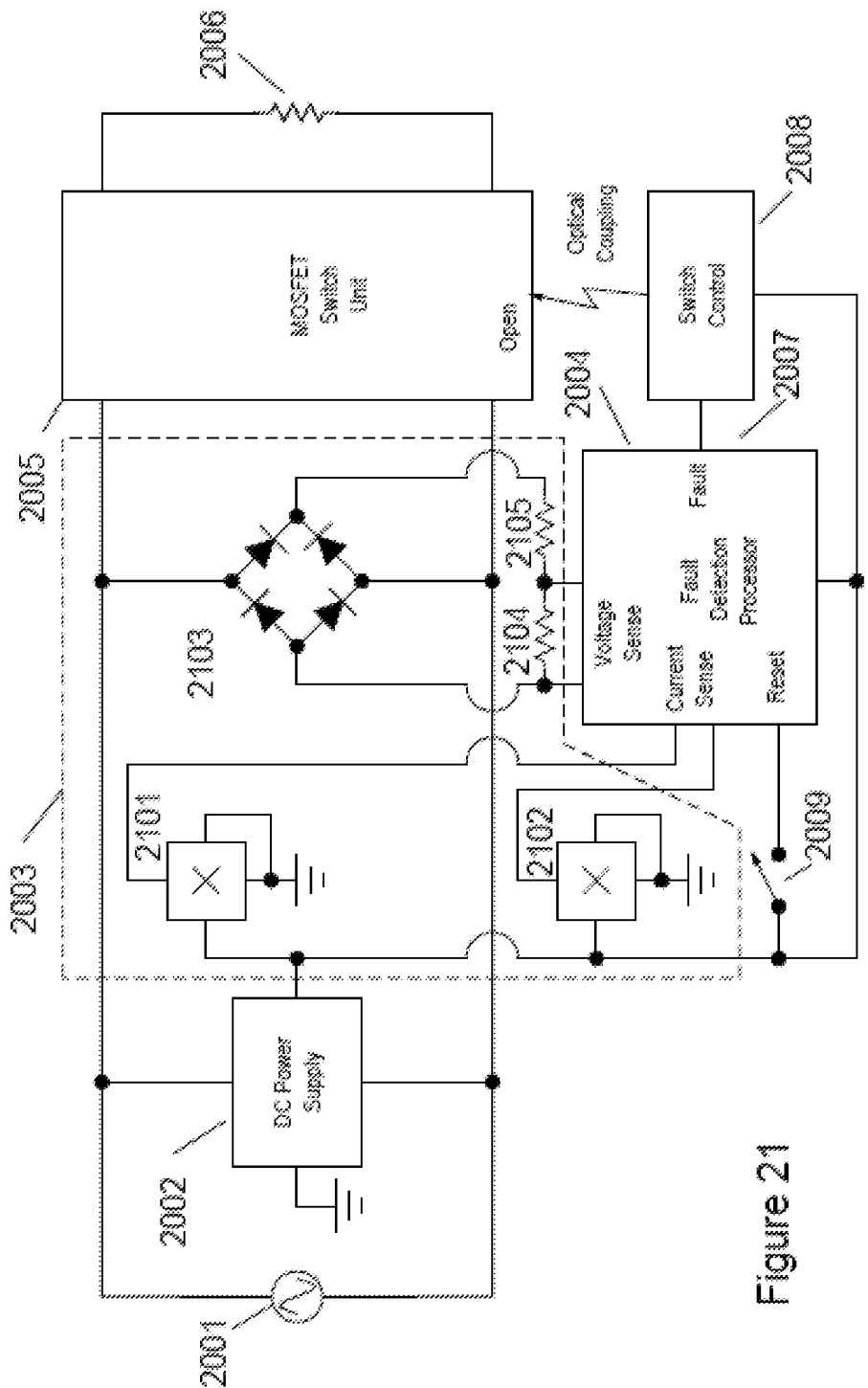
FIG. 21 shows more details of the solid-state circuit interrupter of FIG. 20.
Figure 22:
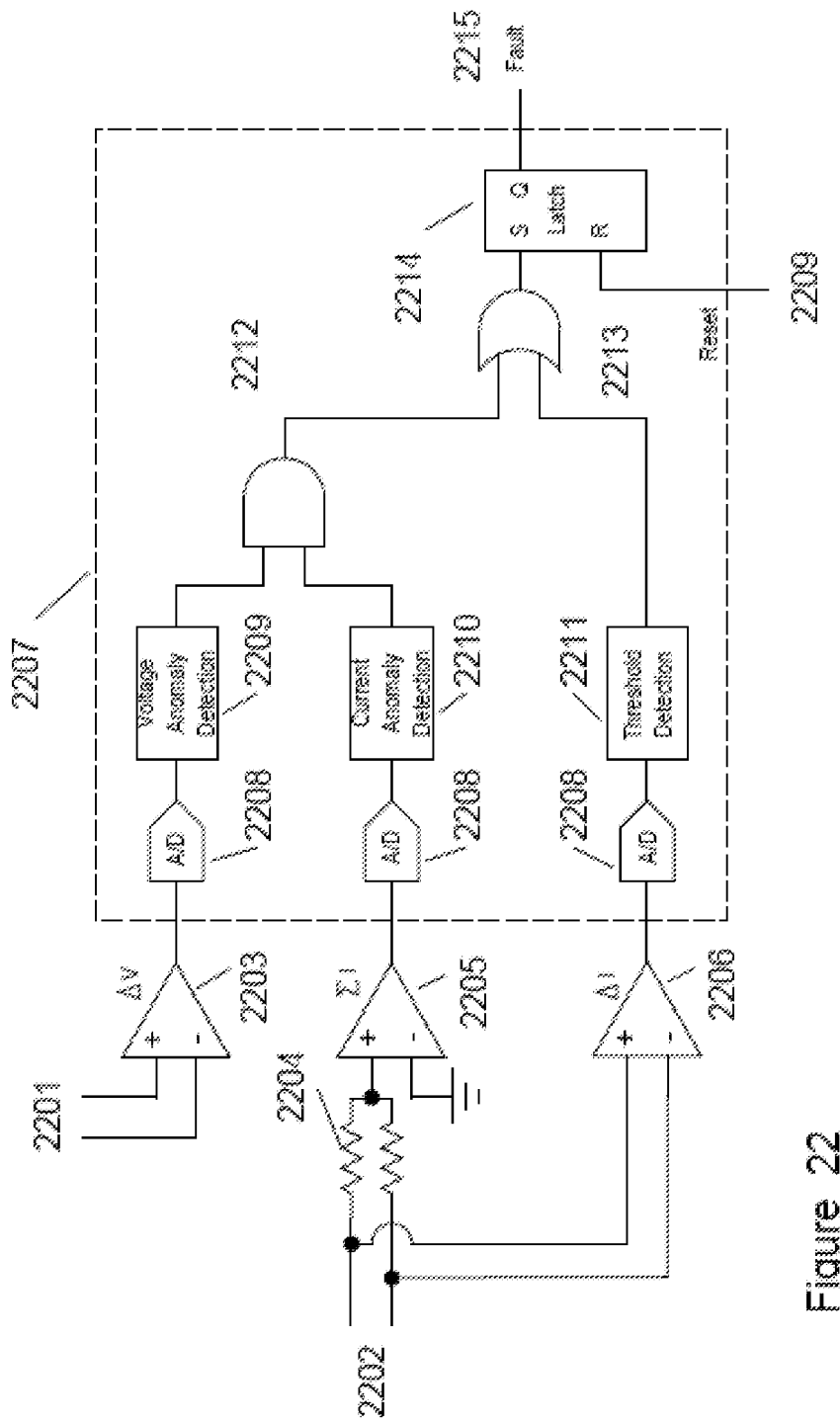
FIG. 22 is a schematic diagram showing an embodiment of the Fault Detection Processor of FIG. 21.

FIG. 21 is a schematic diagram of an embodiment of the solid-state circuit interrupter. AC mains 2001 is connected to load 2006 through bidirectional MOSFET switch unit 2005. Low voltage AC to DC power supply 2002 provides power for mains voltage and current sensing circuit 2003, the fault detection processor 2004 and the bidirectional MOSFET switch control circuit 2008. Sense inputs to the fault detection processor 2004 are provided from the voltage and current sensing circuit 2003. Current sensing is provided using solid-state Hall Effect sensors 2101 and 2102 which provide an output voltage proportional to the current flowing through the sensor while providing isolation of the sense circuitry from the AC mains waveforms. The Hall Effect sensor outputs are fed to the current sense inputs of the fault detection processor 2004. The AC mains voltage waveform is full-wave rectified in bridge unit 2103. (In order to reduce the number of components in the circuit, bridge 2103 can be eliminated and the full-wave rectified waveform obtained directly from the output of the AC-DC converter circuit. Bridge 2103 is illustrated here for clarity.) The full-wave rectified waveform is attenuated using a resistive divider network comprising resistors 2104 and 2105 and applied to the voltage sense inputs of the fault detection processor 2004. Upon detection of a fault, the Fault output 2007 of the fault detection processor 2004 is latched and fed to the control input of electronic switch control circuit 2008 which provides the optical control signal to the bidirectional MOSFET switch unit 2005 which disconnects the load 2006 from the mains 2001 until a reset 2009 is applied to the fault detection processor 2004. In another embodiment the output voltage of the Electronic Switch is varied through the control circuit 2008. In this embodiment upon detection of an arc fault, the output voltage is reduced to a value that is less than a threshold for arcing yet greater than zero. Such an embodiment allows the load circuit to continue operation at a reduced voltage while reducing the chance for a damaging arc. The operation at reduced voltage also allows for continued characterization of the load and mains supply circuit to determine the location of an arc fault for subsequent replacement or repair. FIG. 22 is a schematic diagram showing an embodiment of the Fault Detection Processor. The voltage sense signals are applied to the input terminals of a differential amplifier and the resulting difference signal $\Delta V$ is applied to the input of an analog-to-digital (A/D) converter 2208 within microprocessor 2207. Similarly, the current sense inputs are summed in the input circuit 2204 of operational amplifier 2205 forming a signal proportional to the sum of the currents $\Sigma I$ in the line and neutral legs of the AC mains. The $\Sigma I$ signal is also applied to the input of an A/D converter.

The digitized $\Delta V$ signal is processed by subprogram 2209 within the microprocessor to detect anomalies in the voltage waveform over several cycles that indicate the presence of an arc fault. One nonlimiting example of such a voltage anomaly is the presence of excess high frequency energy impressed upon the normally low frequency AC mains voltage waveform. The digitized $\Sigma I$ signal is processed by subprogram 2210 within microprocessor 2207 to detect anomalies in the current waveforms over several cycles that indicate the presence of an arc fault. One nonlimiting example of such a current anomaly is the occurrence of "shoulders" (flat spots) in the current waveform that occur near zero-crossings of the current waveform. The combined appearance of a voltage waveform anomaly and a current waveform anomaly is one indicator of an arc fault 2212.

The current sense signals are also applied to the inputs of operational amplifier 2206 which forms a difference signal $\Delta I$ proportional to the difference between the currents in the line and neutral legs. The $\Delta I$ signal is digitized and is processed by subprogram 2211 which accomplishes a threshold detection that signals a ground fault 2213. Arc fault 2212 and ground fault 2213 signals are combined and applied to the input of latch 2214 which stores the fault condition 2215 until cleared by an external reset signal.

SUMMARY

A ground-fault circuit interrupter is disclosed, with solid state DPST switching arrangement non-magnetic high dynamic bandwidth sampling and highly reliable triggering. Embodiments include integrated wireless transmission of circuit status data and visual alarms that improve awareness of GFCI performance. In addition, the wireless connectivity that reacts in real time to changing conditions or based upon predefined or predictive conditions. Two primary system-level embodiments are disclosed; a smart electro-mechanical GFCI and a smart solid-start GFCI embodiment. Such GFCIs combine one or multiple of the methods disclosed below. The disclosed improvements address added safety, expanded convenience, added energy awareness, control, energy savings, and improved situational awareness. The disclosed technology combines an array of novel techniques, including AC mains switching techniques, AC to DC conversion techniques, internal short-circuit trip techniques, techniques to communicate status and sensor data wirelessly to enable a variety of innovative use-cases, algorithms for detecting faults, techniques for detecting and protection from internal device failures, techniques for handling new types of loads through over-the-air updates, techniques for cloud service support for remote notifications, control, monitoring and big data collection even during collapsing utility events, circuit techniques for shunt-resistor current sensing, energy metering, leakage and over-current detection, and techniques for avoiding fault conditions. These are novel techniques in and by themselves, but their true impact in terms of addressing the challenges of improving safety, expanded convenience, added energy awareness, control, energy savings, and improved situational awareness may lie in their combination.

We claim:

1. A ground-fault circuit interrupter for use between a single-phase electrical supply (101), having a line hot (103) and a line neutral (104), and, a two-terminal electrical load (806) connected from line hot to line neutral, the ground-fault circuit interrupter comprising:
   a) a first switch (301) located in the line hot between the electrical supply and a first terminal of the load, and,
   b) a second switch (302) located in the line neutral between a second terminal of the load and the electrical supply, and,
   c) the first switch and the second switch each controlled by a switch controller (303), and,
   d) a first current sensor (201) located in the line hot in series with the first switch, and,
   e) a second current sensor (202) located in the line neutral in series with the second switch, and,
   f) a microprocessor (206), programmed to receive a digital signal from each of the first current sensor and the second current sensor, and, to compare the digital signal from the first current sensor with the digital signal from the second current sensor, and, if the digital signals have a difference greater than a first pre-selected value, to determine a ground fault condition, and, to send a first fault signal to the switch controller, and, causing the switch controller to open the first switch and the second switch, and, thereby disconnect the electrical supply from the load, and,
   g) an AC to DC converter (205) providing power to the ground-fault circuit interrupter, and,
   h) wherein the first switch and the second switch each comprise first (802) and second (803) series connected MOSFET devices, each MOSFET device having a drain terminal, a source terminal and a gate terminal, wherein the drain terminal of the first MOSFET device comprises an input terminal of the switch and the drain terminal of the second MOSFET device comprise an output terminal of the switch, and, the source terminals of the first and second MOSFET devices are interconnected at a first control point and the gate terminals of the first and second MOSFET devices are interconnected at a second control point, and a first control switch (1101) is interconnected between the first control point and the second control point, and a bias terminal (808, 810) is connected to the second control point through a second control switch (1102), and, a voltage regulator device (811) is connected between the bias terminal and the first control point, and, a capacitor (1003) is connected in parallel to the voltage regulator device, and, a first rectifier device (808) is connected from the input terminal to the bias terminal through a first current limiting resistor (807), and, a second rectifier device (810) is connected from the second terminal of the load to the bias terminal through a second current limiting resistor (809), and, the switch controller controls the first control switch and the second control switch such that the first control switch is closed when the second control switch is open and vice versa.

2. The ground-fault circuit interrupter of claim 1 further comprising a first electromechanical switch (401) wired in series with the first switch (301), and a second electromechanical switch (402) wired in series with the second switch (302), and, each of the first electromechanical switch and the second electromechanical switch having an electromechanical controller (403) to open and close the electromechanical switch, and, the electromechanical controllers connected to and controlled by the microprocessor (206) further programmed to open the electromechanical switches upon determining a ground fault condition.

3. The ground-fault circuit interrupter of claim 2, wherein the microprocessor is further programmed to close each of the first electromechanical switch and the second electromechanical switch before closing the first switch (301) and the second switch (302), and, to open the first electromechanical switch and the second electromechanical switch after opening the first switch and the second switch.

4. The ground-fault circuit interrupter of claim 1, wherein the microprocessor is further programmed to send a second fault signal to the switch controller if the digital signal from the first current sensor is greater than a second pre-selected value, causing the switch controller to open the first switch and the second switch, and, thereby disconnect the electrical supply from the load.

5. The ground-fault circuit interrupter of claim 1 further including a communication device (207) connected to the microprocessor and the microprocessor further programmed to send alerts out the communication device upon sending a first fault signal or a second fault signal.

6. The ground-fault circuit interrupter of claim 5 wherein the microprocessor is further programmed to receive operating instructions from a remote location.

7. The ground-fault circuit interrupter of claim 6 wherein the operating instruction include programming the microprocessor to open the first switch and the second switch, and, to close the first switch and the second switch.

8. The ground-fault circuit interrupter of claim 6 wherein the operating instructions include values for the first and second pre-selected values.

9. The ground-fault circuit interrupter of claim 1 wherein the AC to DC converter is a sample and hold circuit that includes an energy storage component such that the microprocessor can execute commands after a failure in the electrical supply.

10. The ground-fault circuit interrupter of claim 1 wherein the first current sensor and the second current sensor each comprise:
  a) a sense resistor (501) having a voltage drop proportional to the current through the line, that is buffered by a programmable gain amplifier (503), and, then applied to the input of an analog-digital (A/D) converter (504), producing a digital output signal that is buffered, and, communicated by a digital signal processor (505) to the microprocessor,
  b) wherein the digital output signal, and, external digital input signals to the digital signal processor are buffered through optical isolators (506, 507), and, multiplexed onto a bidirectional digital bus (211) to communicate with the microprocessor, and,
  c) wherein DC power is supplied to the first current sensor by a first DC power supply (508) having an operating voltage referenced to the line hot, and,
  d) wherein DC power is supplied to the second current sensor by a second DC power supply (509) having an operating voltage referenced to the line neutral.

11. A ground-fault circuit interrupter for use between a single-phase electrical supply (101), having a line hot (103) and a line neutral (104), and, a two- terminal electrical load (806) connected from line hot to line neutral, the ground-fault circuit interrupter comprising:
  a) a switch (301) located in the line hot between the electrical supply and a first terminal of the load, and,
  b) the switch controlled by a switch controller (303), and,
  c) a first current sensor (201) located in the line hot in series with the first switch, and,
  d) a second current sensor (202) located in the line neutral between a second terminal of the load and the electrical supply, and,
  e) a microprocessor (206), programmed to receive a digital signal from each of the first current sensor and the second current sensor, and, to compare the digital signal from the first current sensor with the digital signal from the second current sensor, and, if the digital signals have a difference greater than a first pre-selected value, to determine a ground fault condition, and, to send a first fault signal to the switch controller, and, causing the switch controller to open the switch, and, thereby disconnect the electrical supply from the load, and,
  f) an AC to DC converter (205) providing power to the ground-fault circuit interrupter, and,
  g) wherein the switch comprises first (802) and second (803) series connected MOSFET devices, each MOSFET device having a drain terminal, a source terminal and a gate terminal, wherein the drain terminal of the first MOSFET device comprises an input terminal of the switch and the drain terminal of the second MOSFET device comprise an output terminal of the switch, and, the source terminals of the first and second MOSFET devices are interconnected at a first control point and the gate terminals of the first and second MOSFET devices are interconnected at a second control point, and a first control switch (1101) is interconnected between the first control point and the second control point, and a bias terminal (808, 810) is connected to the second control point through a second control switch (1102), and, a voltage regulator device (811) is connected between the bias terminal and the first control point, and, a capacitor (1003) is connected in parallel to the voltage regulator device, and, a first rectifier device (808) is connected from the input terminal to the bias terminal through a first current limiting resistor (807), and, a second rectifier device (810) is connected from the second terminal of the load to the bias terminal through a second current limiting resistor (809), and, the switch controller controls the first control switch and the second control switch such that the first control switch is closed when the second control switch is open and vice versa.

12. The ground-fault circuit interrupter of claim 11 further comprising an electromechanical switch wired in series with the switch, and, the electromechanical switch having an electromechanical controller to open and close the electromechanical switch, and, the electromechanical controller connected to and controlled by the microprocessor further programmed to open the electromechanical switch upon determining a ground fault condition.

13. The ground-fault circuit interrupter of claim 12, wherein the microprocessor is further programmed to close the electromechanical switch before closing the switch, and, to open the electromechanical switch after opening the switch.

14. The ground-fault circuit interrupter of claim 11, wherein the microprocessor is further programmed to send a second fault signal to the switch controller if the digital signal from the first current sensor is greater than a second pre-selected value, causing the switch controller to open the switch, and, thereby disconnect the electrical supply from the load.

15. The ground-fault circuit interrupter of claim 11 further including a communication device connected to the microprocessor and the microprocessor further programmed to send alerts out the communication device upon sending a first fault signal or a second fault signal.

16. The ground-fault circuit interrupter of claim 15 wherein the microprocessor is further programmed to receive operating instructions from a remote location.

17. The ground-fault circuit interrupter of claim 16 wherein the operating instruction include programming the microprocessor to open the switch, and, to close the switch.

18. The ground-fault circuit interrupter of claim 16 wherein the operating instructions include values for the first and second pre-selected values.

19. The ground-fault circuit interrupter of claim 11 wherein the AC to DC converter is a sample and hold circuit that includes an energy storage component such that the microprocessor can execute commands after a failure in the electrical supply.

20. The ground-fault circuit interrupter of claim 11 wherein the first current sensor and the second current sensor each comprise:
  a) a sense resistor having a voltage drop proportional to the current through the line, that is buffered by a programmable gain amplifier, and, then applied to the input of an analog-digital (A/D) converter, producing a digital output signal that is buffered, and, communicated by a digital signal processor to the microprocessor,
  b) wherein the digital output signal, and, external digital input signals to the digital signal processor are buffered through optical isolators, and, multiplexed onto a bidirectional digital bus to communicate with the microprocessor, and,
  c) wherein DC power is supplied to the first current sensor by a first DC power supply having an operating voltage referenced to the line hot, and, d) wherein DC power is supplied to the second current sensor by a second DC power supply having an operating voltage referenced to the line neutral.

21. An electrical-fault circuit interrupter for use between a single-phase electrical supply (101), having a line hot (103) and a line neutral (104), and, a two-terminal electrical load (806), having a type of load, connected from line hot to line neutral, the electrical-fault circuit interrupter comprising:
  a) a switch (301) located in the line hot between the electrical supply and a first terminal of the load, and,
  b) the switch controlled by a switch controller (303), and,
  c) a first current sensor (201) located in the line hot between the electrical supply and the switch, the first current sensor producing a first digital waveform signal proportional to a current flowing through line hot, and,
  d) a second current sensor (202) located in the line neutral between a second terminal of the load and the electrical supply, the second current sensor producing a second digital waveform signal proportional to a current flowing through line neutral, and,
  e) a first voltage sensor (203) connected between line hot and line neutral and located between the electrical supply and the switch, the first voltage sensor producing a third digital waveform signal proportional to the voltage of the electrical supply, and,
  f) a second voltage sensor (204) connected between line hot and line neutral and located between the switch and the load, the second voltage sensor producing a fourth digital waveform signal proportional to the voltage at the load, and,
  g) a microprocessor (206), programmed to receive the digital waveform signals from each of the first current sensor, the second current sensor, the first voltage sensor, and, the second voltage sensor, the waveforms all sampled at frequencies optimized for detection of the type of load, and,
  h) to compare the digital waveform signals, and, to determine from that comparison at least one of:
    i) whether the difference in current through line hot and line neutral exceed a first pre-selected limit, thereby indicating a first fault condition, and, to send a first fault signal to the switch controller, causing the switch controller to open the switch and disconnect the load from the electrical supply, and,
    ii) whether the current through the load exceeds a second preselected limit, thereby indicating a second fault condition, and, to send a second fault signal to the switch controller, causing the switch controller to open the switch and disconnect the load from the electrical supply, and,
  i) wherein the switch comprises first (802) and second (803) series connected MOSFET devices, each MOSFET device having a drain terminal, a source terminal and a gate terminal, wherein the drain terminal of the first MOSFET device comprises an input terminal of the switch and drain terminal of the second MOSFET device comprise an output terminal of the switch, and, the source terminals of the first and second MOSFET devices are interconnected at a first control point and the gate terminals of the first and second MOSFET devices are interconnected at a second control point, and a first control switch (1101) is interconnected between the first control point and the second control point, and a bias terminal (808, 810) is connected to the second control point through a second control switch (1102), and, a voltage regulator device (811) is connected between the bias terminal and the first control point, and, a capacitor (1003) is connected in parallel to the voltage regulator device, and, a first rectifier device (808) is connected from the input terminal to the bias terminal through a first current limiting resistor (807), and, a second rectifier device (810) is connected from the second terminal of the load to the bias terminal through a second current limiting resistor (809), and, the switch controller controls the first control switch and the second control switch such that the first control switch is closed when the second control switch is open and vice versa.

22. The electrical-fault circuit interrupter of claim 21 wherein the switch is programmably opened and closed by the microprocessor through the switch controller such that electrical supply to the load is modulated during a modulation period of time and the digital waveform signals are acquired by the microprocessor, before, during, and, after the modulation period of time.

23. The electrical-fault circuit interrupter of claim 22, wherein, based upon comparisons of the digital waveform signals before, during and after modulation, the type of load is identified as one of: Pure Resistive Load, Constant power Resistive load with power correction, Pure Reactive (capacitive or inductive) load, and, Constant Power Reactive load.

24. The electrical-fault circuit interrupter of claim 21 wherein the first current sensor and the second current sensors are Hall effect sensors.

25. The ground-fault circuit interrupter of claim 21 further comprising an electromechanical switch wired in series with the switch, and, the electromechanical switch has an electromechanical controller to open and close the electromechanical switch, and, the electromechanical controller is connected to, and controlled by the microprocessor, further programmed to open the electromechanical switch upon determining a ground fault condition.

26. The electrical-fault circuit interrupter of claim 25, wherein the microprocessor is further programmed to close the electromechanical switch before the switch, and, to open the electromechanical switch after the opening of the switch.

27. The electrical-fault circuit interrupter of claim 21 further including a communication device connected to the microprocessor, and, the microprocessor is further programmed to send alerts out the communication device upon detection of at least one of: a first fault condition, and, a second fault condition, and, to receive operating instructions in through the communication device from a remote location.

28. The electrical-fault circuit interrupter of claim 27 wherein the operating instruction include programming the microprocessor to open the switch, and, to close the switch.

29. The electrical-fault circuit interrupter of claim 27 wherein the operating instructions include values for the first and second pre-selected values.

30. The electrical-fault circuit interrupter of claim 21 wherein the AC to DC converter is a sample and hold circuit that includes an energy storage component such that the microprocessor can execute commands after a failure in the electrical supply.

* * * * *

UNITED STATES PATENT AND TRADEMARK OFFICE
CERTIFICATE OF CORRECTION

PATENT NO. : 11,721,508 B2
APPLICATION NO. : 17/660785
DATED : August 8, 2023
INVENTOR(S) : Mark Telefus and Stephen C. Gerber It is certified that error appears in the above-identified patent and that said Letters Patent is hereby corrected as shown below:

On the Title Page

Column 1, Item (22) the PCT filed date is listed as:
Jun.12, 2019
The correct date is:
Dec. 6, 2019

Signed and Sealed this
Twenty-third Day of July, 2024

Katherine Kelly Vidal
*Director of the United States Patent and Trademark Office*